(12) United States Patent
Kim et al.

(10) Patent No.: US 9,972,701 B2
(45) Date of Patent: May 15, 2018

(54) SEMICONDUCTOR DEVICE

(71) Applicant: SAMSUNG ELECTRONICS CO., LTD., Suwon-si, Gyeonggi-do (KR)

(72) Inventors: Dong-woo Kim, Incheon (KR);
Hyun-jung Lee, Suwon-si (KR);
Sun-jung Kim, Suwon-si (KR);
Seung-hun Lee, Hwaseong-si (KR);
Keum-seok Park, Seoul (KR); Edward Namkyu Cho, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/443,160

(22) Filed: Feb. 27, 2017

(65) Prior Publication Data
US 2017/0250261 A1    Aug. 31, 2017

(30) Foreign Application Priority Data

Feb. 29, 2016  (KR) ........................ 10-2016-0024710

(51) Int. Cl.
| *H01L 29/49* | (2006.01) |
| *H01L 29/66* | (2006.01) |
| *H01L 29/423* | (2006.01) |
| *H01L 29/06* | (2006.01) |
| *H01L 29/786* | (2006.01) |
| *B82Y 10/00* | (2011.01) |
| *H01L 29/417* | (2006.01) |
| *H01L 29/51* | (2006.01) |

(Continued)

(52) U.S. Cl.
CPC ........ *H01L 29/66742* (2013.01); *B82Y 10/00* (2013.01); *H01L 29/0653* (2013.01); *H01L 29/0673* (2013.01); *H01L 29/1037* (2013.01); *H01L 29/1079* (2013.01); *H01L 29/41725* (2013.01); *H01L 29/42392* (2013.01); *H01L 29/515* (2013.01); *H01L 29/66439* (2013.01); *H01L 29/775* (2013.01); *H01L 29/78618* (2013.01); *H01L 29/78696* (2013.01)

(58) Field of Classification Search
CPC ............. H01L 29/4991; H01L 29/0673; H01L 29/42392; H01L 29/66742; H01L 29/78618; H01L 29/78696
See application file for complete search history.

(56) References Cited

U.S. PATENT DOCUMENTS

| 8,097,515 B2 | 1/2012 | Bangsaruntip et al. |
| 8,728,885 B1 | 5/2014 | Pham et al. |
| 8,896,101 B2 | 11/2014 | Then et al. |

(Continued)

FOREIGN PATENT DOCUMENTS

KR    10-2015-0051168 A    5/2015

*Primary Examiner* — Christine Enad
(74) *Attorney, Agent, or Firm* — Lee & Morse, P.C.

(57) ABSTRACT

A semiconductor device includes a fin-type active area, nanosheets, a gate, a source/drain region, and insulating spacers. The fin-type active area protrudes from a substrate in a first direction. The nanosheets are spaced from an upper surface of the fin-type active area and include channel regions. The gate is over the fin-type active area. The source/drain region is connected to the nanosheets. The insulating spacers are in the fin-type active area and between the nanosheets. Air spaces are between the insulating spacers and the source/drain region based on positions of the insulating spacers.

20 Claims, 77 Drawing Sheets

(51) Int. Cl.
*H01L 29/775* (2006.01)
*H01L 29/10* (2006.01)

(56) References Cited

U.S. PATENT DOCUMENTS

| | | |
|---|---|---|
| 8,987,794 B2 | 3/2015 | Rachmady et al. |
| 8,994,081 B2 | 3/2015 | Leobandung |
| 2014/0001441 A1 | 1/2014 | Kim et al. |
| 2014/0225169 A1 | 8/2014 | Suk et al. |
| 2015/0079751 A1 | 3/2015 | Alptekin et al. |
| 2015/0090958 A1 | 4/2015 | Yang et al. |
| 2015/0123215 A1 | 5/2015 | Obradovic et al. |
| 2015/0325648 A1 | 11/2015 | Cea et al. |
| 2017/0069763 A1* | 3/2017 | Doris ................. H01L 21/0228 |
| 2017/0110554 A1* | 4/2017 | Tak ..................... H01L 29/4991 |
| 2017/0141207 A1* | 5/2017 | Cheng ................ H01L 29/6681 |

* cited by examiner

SEMICONDUCTOR DEVICE

CROSS-REFERENCE TO RELATED APPLICATION

Korean Patent Application No. 10-2016-0024710, filed on Feb. 29, 2016, and entitled, "Semiconductor Device," is incorporated by reference herein in its entirety.

BACKGROUND

1. Field

One or more embodiments described herein relate to a semiconductor device.

2. Description of the Related Art

Efforts are being made to increase the integration of semiconductor devices. Increasing integration reduces size. At some point, the scale of semiconductor devices will reach their limit, so that current approaches can no longer be used. In an attempt to overcome these limitations, and in order to enhance performance, attempts have been made to modify the design of semiconductor devices for the purpose of, for example, reducing parasitic resistance and parasitic capacitance.

SUMMARY

In accordance with one or more embodiments, a semiconductor device includes a fin-type active area protruding from a substrate in a first direction; a plurality of nanosheets spaced from and extending parallel to an upper surface of the fin-type active area, each of the nanosheets including a channel region; a gate extending over the fin-type active area in a second direction crossing the first direction and surrounding at least some of the nanosheets; a source/drain region connected to the nanosheets; and insulating spacers disposed between the upper surface of the fin-type active area and the nanosheets, disposed between the nanosheets, wherein air spaces are between the insulating spacers and the source/drain region based on positions of the insulating spacers.

In accordance with one or more other embodiments, a semiconductor device includes a substrate including an active area; at least one nanosheet stack structure spaced from and facing an upper surface of the active area, the at least one nanosheet stack structure including a plurality of nanosheets, each of the nanosheets including a channel region; a gate extending over the active area in a second direction and covering the at least one nanosheet stack structure, the gate including a first gate portion on the at least one nanosheet stack structure and a plurality of second gate portions, each of the plurality of second gate portions being under a lower side of each of the nanosheets; a gate dielectric layer between the at least one nanosheet stack structure and the gate; a source/drain region connected to one end of each of neighboring ones of the nanosheets; a first insulating spacer on the nanosheets and covering side walls of the gate; and a plurality of second insulating spacers disposed between the gate and the source/drain region, disposed between the upper surface of the active area and the at least one nanosheet stack structure, and disposed between the nanosheets, wherein a plurality of air spaces are disposed between the plurality of second insulating spacers and the source/drain region based on positions of the second insulating spacers.

In accordance with one or more other embodiments, a semiconductor device includes a substrate including an active area; at least one nanosheet stack structure spaced from and facing an upper surface of the active area, the at least one nanosheet stack structure including a plurality of nanosheets, each of the nanosheets including a channel region; a gate extending over the active area in a second direction and covering the at least one nanosheet stack structure, the gate including a first gate portion on the at least one nanosheet stack structure and a plurality of second gate portions on a lower side of each of the nanosheets; a source/drain region connected to one end of each of neighboring ones of the nanosheets; and a plurality of first insulating spacers between the gate and the source/drain region in spaces between the upper surface of the active area and the at least one nanosheet stack structure and spaces between the nanosheets, wherein a plurality of air spaces are between the first insulating spacers and the source/drain region.

BRIEF DESCRIPTION OF THE DRAWINGS

Features will become apparent to those of skill in the art by describing in detail exemplary embodiments with reference to the attached drawings in which.

DETAILED DESCRIPTION

FIGS. 1 through 22 are cross-sectional views illustrating various stages in a method for manufacturing a semiconductor device according to an embodiment. FIGS. 1, 2A, 3A, 4A, 5A, 6A, 7A, 8 to 14, and 16 to 22 are cross-sectional views of line X-X' in FIG. 24A. FIGS. 2B, 3B, 4B, 5B, 6B, and 7B are cross-sectional views of line Y-Y' in FIG. 24A. FIGS. 15A through 15E are enlarged views of a region P1 in FIG. 14.

Figure 1:
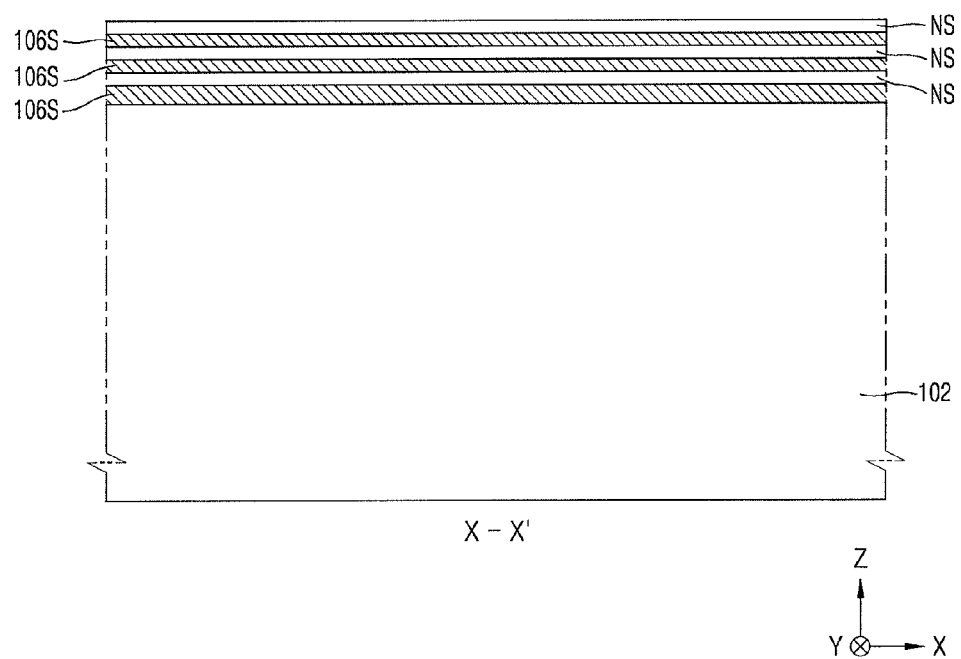
FIGS. 1-22 illustrate various stages in a method for manufacturing a semiconductor device according to an embodiment.

Referring to FIG. 1, a plurality of sacrificing semiconductor layers 106S and a plurality of nanosheet semiconductor layers NS are alternately stacked on a substrate 102. The substrate 102 may include a semiconductor such as Si or Ge or a compound semiconductor such as SiGe, SiC, GaAs, InAs, or InP. In some embodiments, the substrate 102 may include at least one of a Group III-V material or a Group IV material.

The Group III-V material may be a binary, ternary, or quaternary compound including at least one Group III element and at least one Group V element. The Group III-V material may be a compound including, as a Group III element, at least one of In, Ga, and Al and, as a Group V element, at least one of As, P, and Sb. For example, the Group III-V material may be selected from InP, $In_zGa_{1-z}As$ (0≤z≤1), and AlzGa1−zAs (0≤z≤1). The binary compound may be . . . for example, one of InP, GaAs, InAs, InSb, or GaSb. The ternary compound may be, for example, one of InGaP, InGaAs, AlInAs, InGaSb, GaAsSb, or GaAsP.

The Group IV material may be Si or Ge. In one embodiment, a Group III-V material and a Group IV material may be used. The Group III-V material and the Group IV material (e.g., Ge) may be used as a channel material for forming a low-power and high-speed transistor. A high-performance CMOS may be formed using a semiconductor substrate including the Group III-V material (e.g., GaAs) having mobility of electrons higher than that of a Si substrate, and a semiconductor substrate including a semiconductor material (e.g., Ge) having mobility of holes greater than the Si substrate.

According to some embodiments, when an NMOS transistor is formed on the substrate 102, the substrate 102 may include one of the examples of the Group III-V materials. According to some other embodiments, when a PMOS transistor is formed on the substrate 102, at least a part of the substrate 102 may include Ge. In another example, the substrate 102 may have a semiconductor on insulator (SOI) structure. The substrate 102 may include a conductive region, for example, a sell doped with impurities or a structure doped with impurities.

The sacrificing semiconductor layers 106S and the nanosheet semiconductor layers NS may include different semiconductor materials. In some embodiments, the nanosheet semiconductor layers NS may include different semiconductor a single material. In some embodiments, the nanosheet semiconductor layers NS may include the same material as the material of the substrate 102.

In some embodiments, the sacrificing semiconductor layers 106S may include SiGe and the nanosheet semiconductor layers NS may include Si. The sacrificing semiconductor layers 106S and nanosheet semiconductor layers NS may include different materials in other embodiments. The thickness of the sacrificing semiconductor layer 106 closest to the substrate 102 may be greater than the thicknesses of the sacrificing semiconductor layers 106. In one embodiment, the sacrificing semiconductor layers 106 may have the same thickness.

Figure 2A:
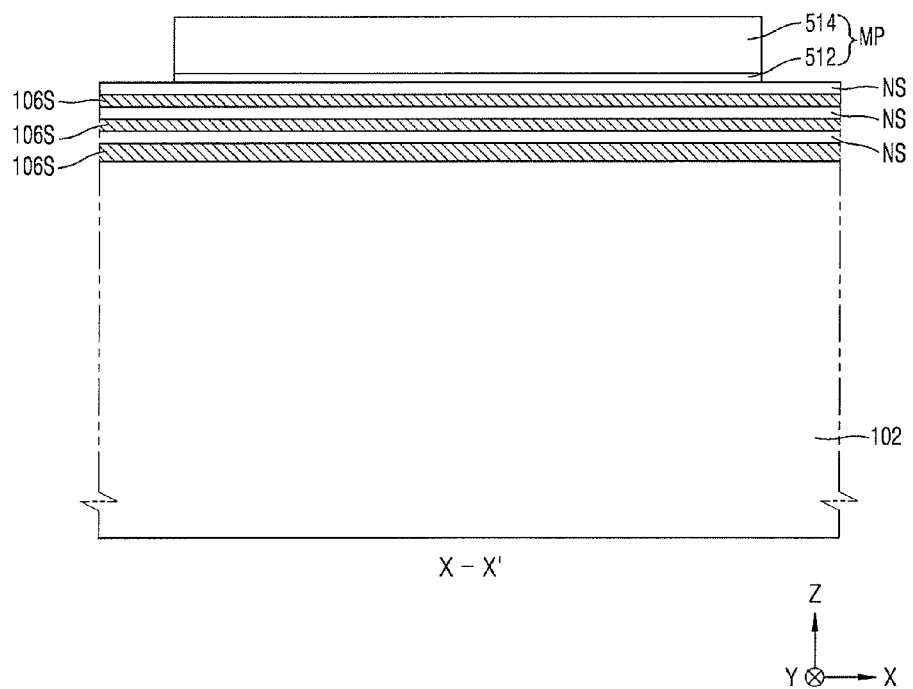
Figure 2B:
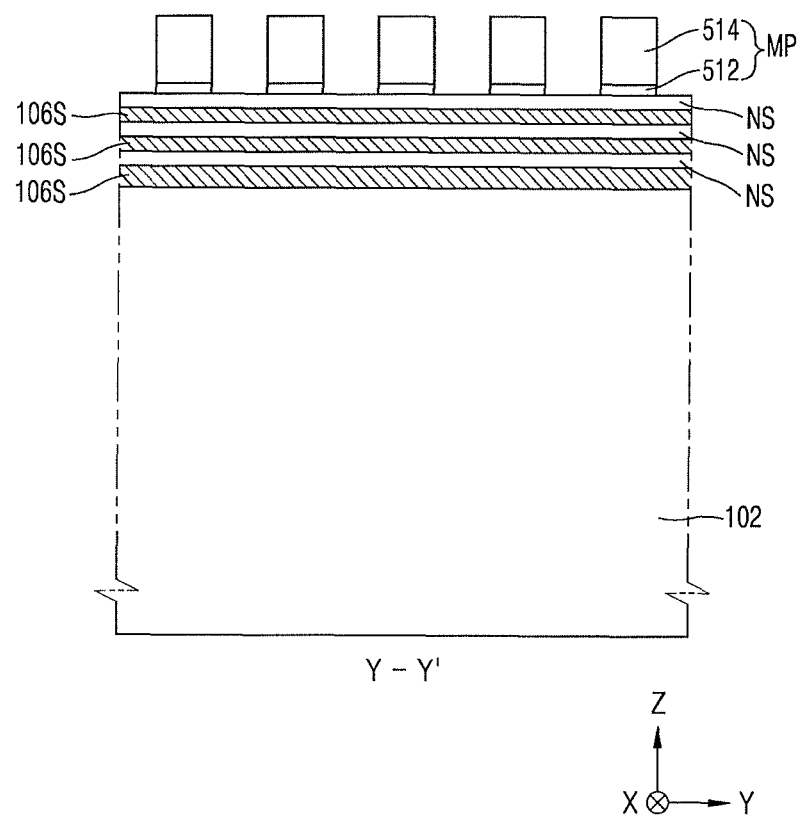

Referring to FIGS. 2A and 2B, a mask pattern MP may be formed on a stack structure of the sacrificing semiconductor layers 106S and the nanosheet semiconductor layers NS. The mask pattern MP may include a plurality of line patterns extending in parallel to one direction (X direction). The mask pattern MP may include, for example, a pad oxide layer pattern 512 and a hard mask pattern 514. The hard mask pattern 514 may include, for example, silicon nitride, polysilicon, a spin-on hardmask (SOH) material, or a combination of these. In some embodiments, the SOH material may include a hydrocarbon compound having a relatively high carbon content ranging from about 85 w % to about 99 w % with respect to a total content of the SOH material or derivatives of the hydrocarbon compound.

Figure 3A:
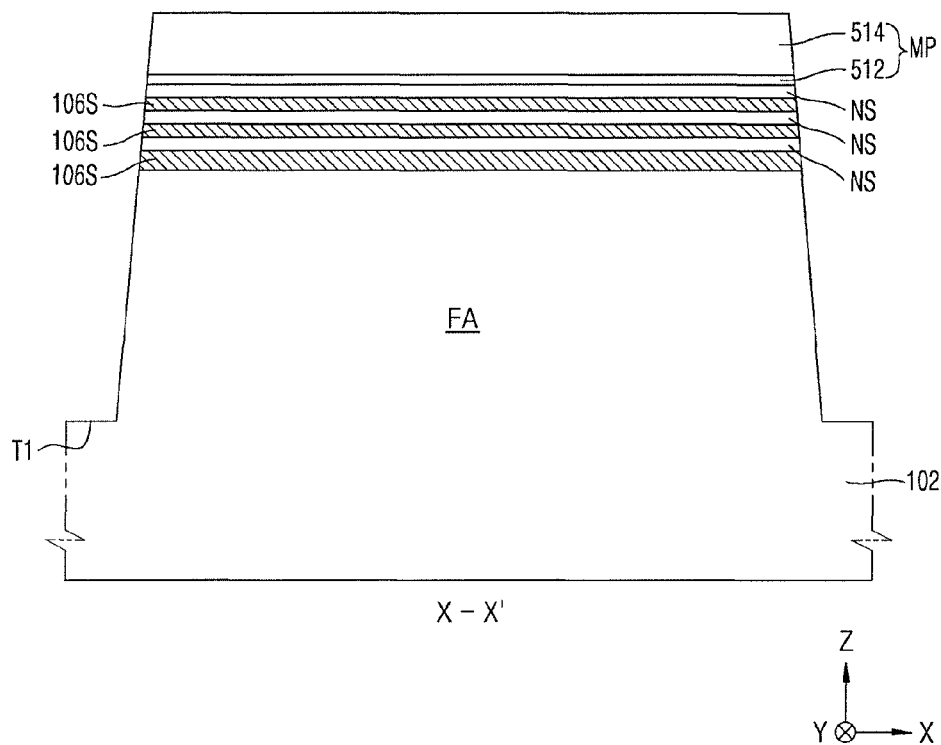
Figure 3B:
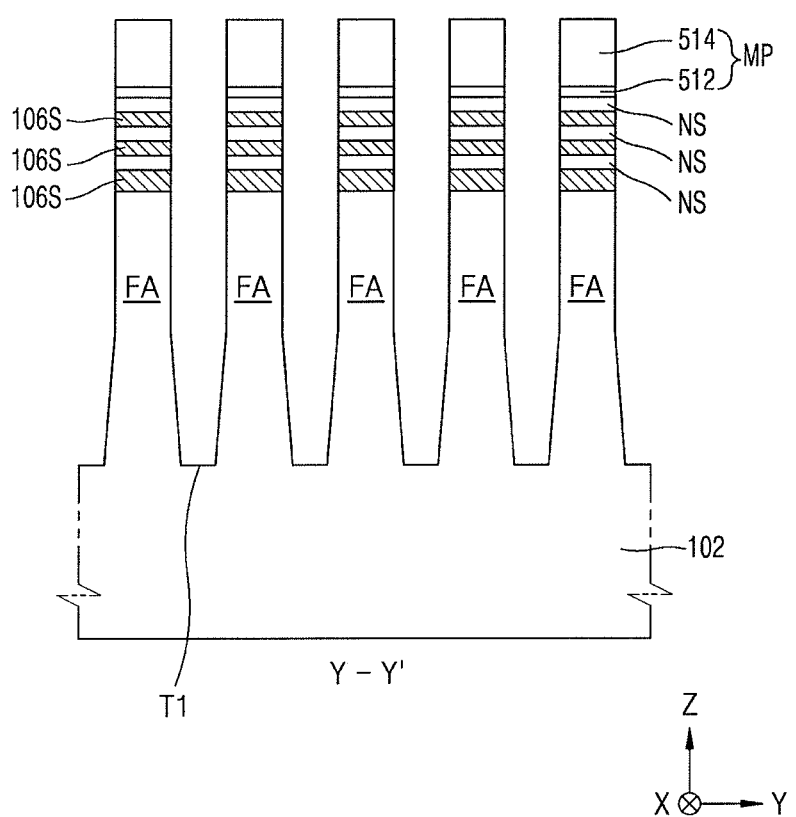

Referring to FIGS. 3A and 3B, the mask pattern MP may be used as an etch mask to form a plurality of first trenches T1, by etching the stack structure of the sacrificing semiconductor layers 106S and the nanosheet semiconductor layers NS and a part of the substrate 102. As a result, a plurality of fin-type active areas FA defined by the first trenches T1 may be formed. After the fin-type active areas FA are formed, the stack structure of the sacrificing semiconductor layers 106S and the nanosheet semiconductor layers NS may remain on the fin-type active areas FA.

Figure 4A:
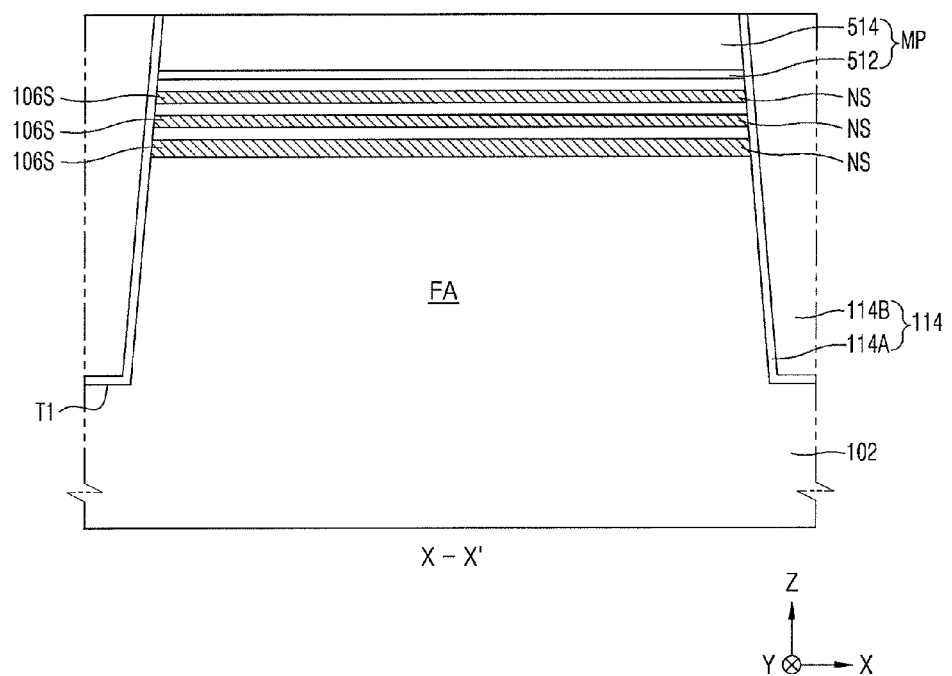
Figure 4B:
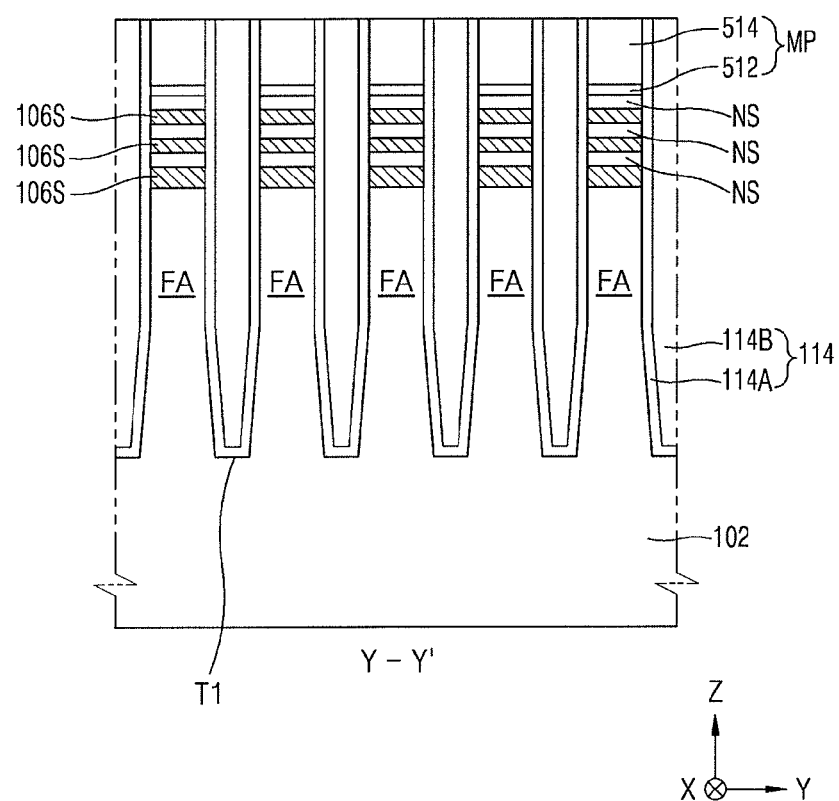

Referring to FIGS. 4A and 4B, a shallow trench isolation (STI) layer 114 may be formed in each of the first trenches T1. The STI layer 114 may include an insulating liner 114A conformally covering an inner wall of each of the first trenches T1 and a gapfill insulating layer 114B filling each of the first trenches T1 on the insulating liner 114A. The insulating liner 114A covering the inner wall of each of the first trenches T1 may include, for example, an oxide layer, silicon nitride (SiN), silicon oxynitride (SiON), silicon boronitride (SiBN), a silicon carbide (SiC), SiC:H, SiCN, SiCN:H, SiOCN, SiOCN:H, silicon oxycarbide (SiOC), silicon dioxide ($SiO_2$), polysilicon, or a combination of these. In some embodiments, the insulating liner 114A may have a thickness ranging from about 10 to about 100 Å.

In some embodiments, the gapfill insulating layer 114B may include an oxide layer. In some embodiments, the gapfill insulating layer 114B may include an oxide layer formed through a deposition process or a coating process. In some embodiments, the gap fill insulating layer 114B may include an oxide layer formed through a flowable chemical vapour deposition (FCVD) process or a spin coating process. For example, the gapfill insulating layer 114B may include fluoride silicate glass (FSG), undoped silicate glass (USG), boro-phospho-silicate glass (BPSG), phosphor-silicate glass (PSG), flowable oxide (FOX), plasma enhanced tetra-ethyl-ortho-silicate (PE-TEOS), or tonen silazene (TOSZ), but is not limited thereto.

Figure 5A:
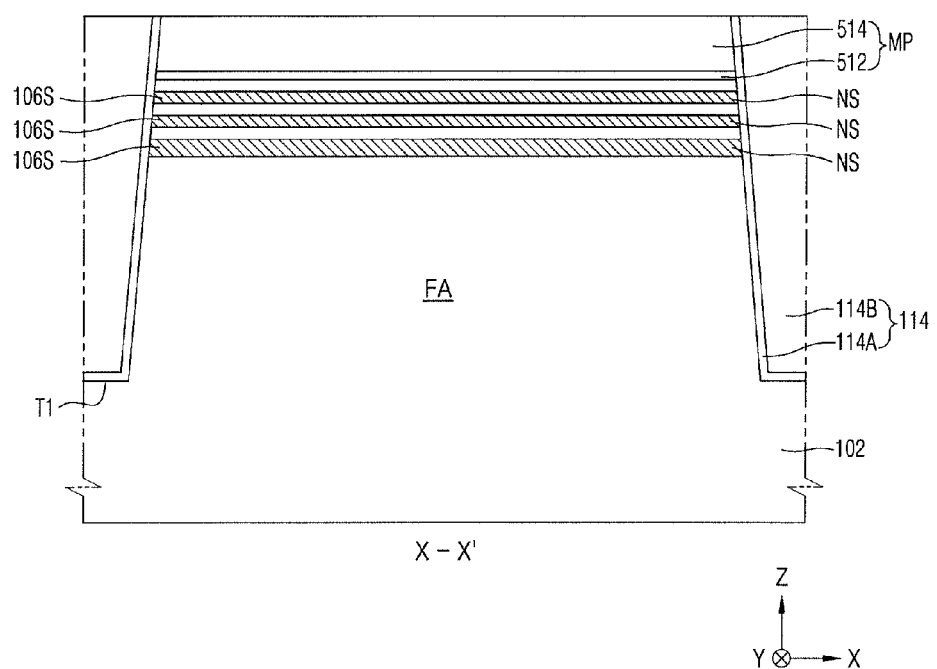
Figure 5B:
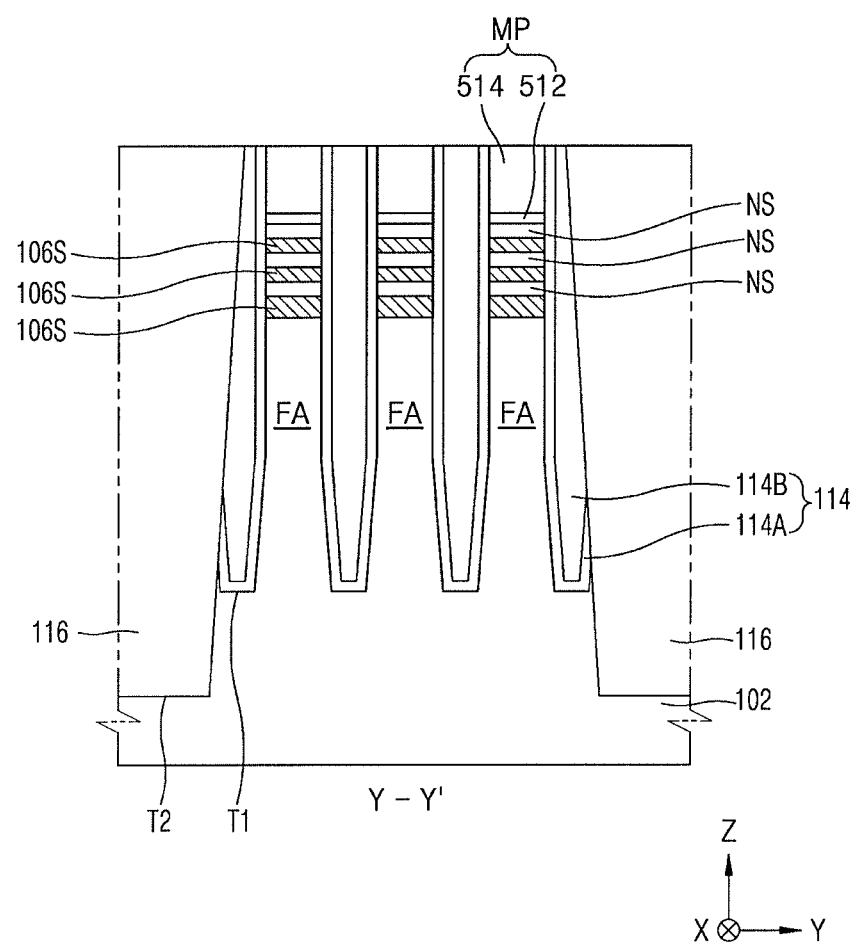

Referring to FIGS. 5A and 5B, a second trench T2 defining a device region DR (see, e.g., FIG. 24A) by etching some structures from a resultant formed by the fin-type active areas FA and the STI layer 114 may be formed and then a device isolation layer 116 may be formed in the second trench T2.

The device isolation layer 116 filling the second trench T2 may include, for example, an oxide layer, a nitride layer, or a combination of these. In some embodiments, the device isolation layer 116 and the gapfill insulating layer 114B may include the same material.

Figure 6A:
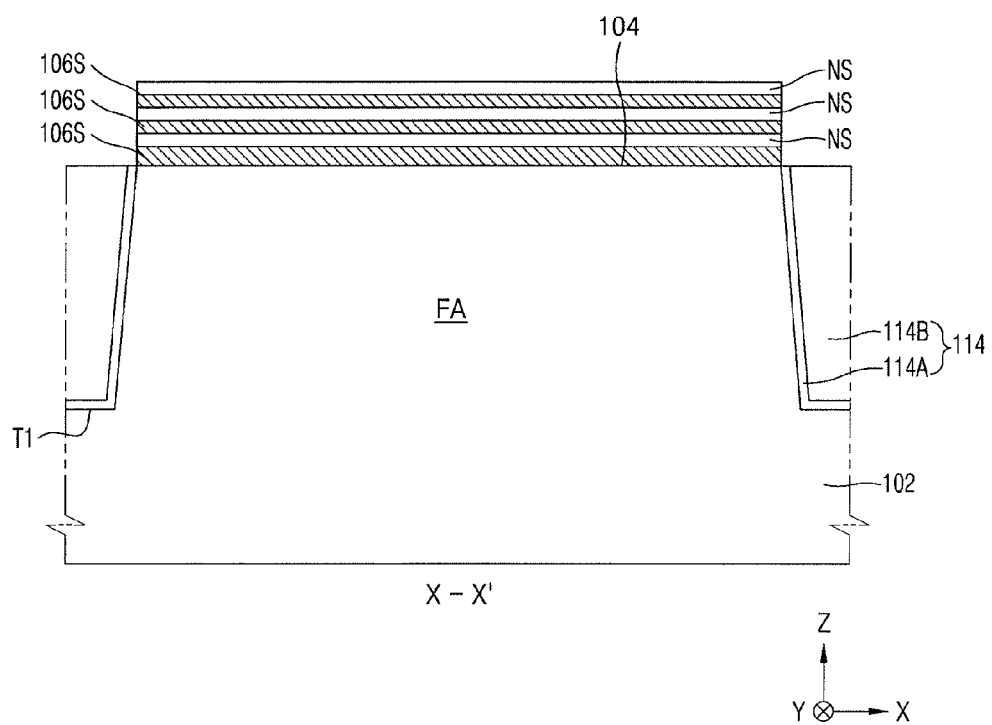
Figure 6B:
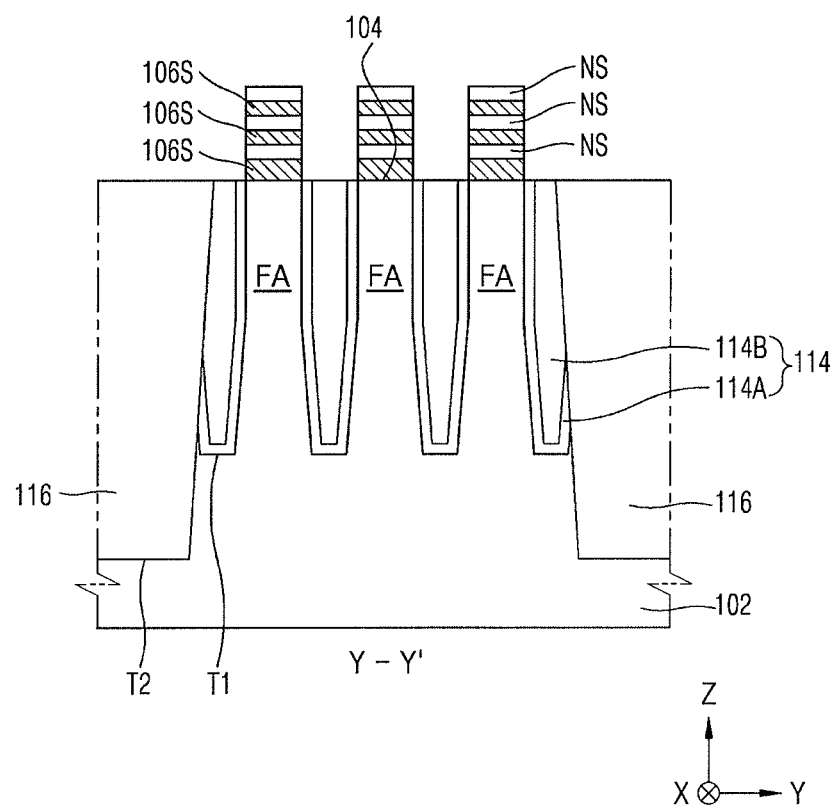

Referring to FIGS. 6A and 6B, the remaining mask pattern MP may be removed from the stack structure of the sacrificing semiconductor layers 106S and the nanosheet semiconductor layers NS. Also, a recess process for removing some thicknesses of upper portions of the STI layer 114 and the device isolation layer 116 may be performed. The recess process may be performed such that an upper surface of each of the STI layer 114 and the device isolation layer 116 may be approximately the same or similar to an upper surface 104 of each of the fin-type active areas FA. As a result, a side wall of the stack structure of the sacrificing semiconductor layers 106S and the nanosheet semiconductor layers NS on the fin-type active areas FA may be exposed. To perform the recess process, a dry etching process, a wet etching process, or a combination etching process of dry and wet etching may be used, for example.

In some embodiments, after the mask pattern MP is removed, and before the recess process for removing some thicknesses of upper portions of the STI layer 114 and the device isolation layer 116 is removed, an ion implantation process may be performed to implant impurity ions for adjusting a threshold voltage into upper portions of the nanosheet semiconductor layers NS and the fin-type active areas FA. In some embodiments, during the ion implantation process for implanting impurity ions for adjusting the threshold voltage, boron (B) ions may be implanted into a region in which an NMOS transistor is formed as impurities, and phosphor (P) or arsenic (As) ions may be implanted into a region in which a PMOS transistor is formed as impurities.

Figure 7A:
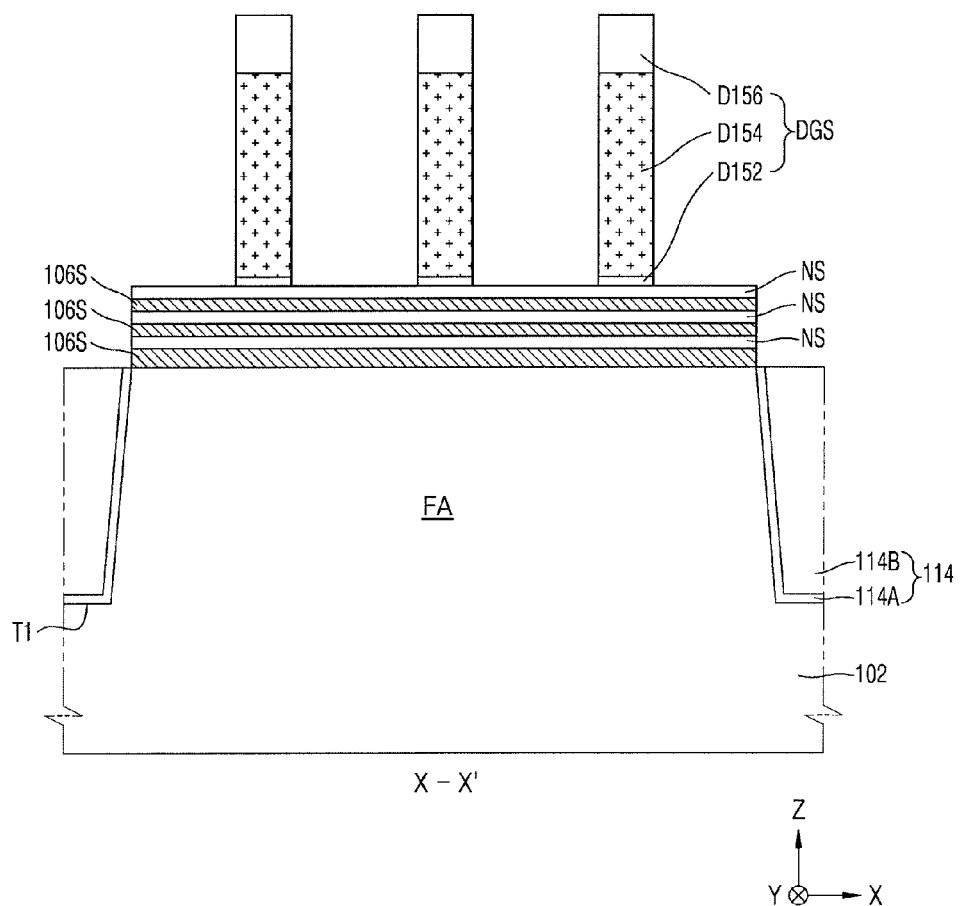
Figure 7B:
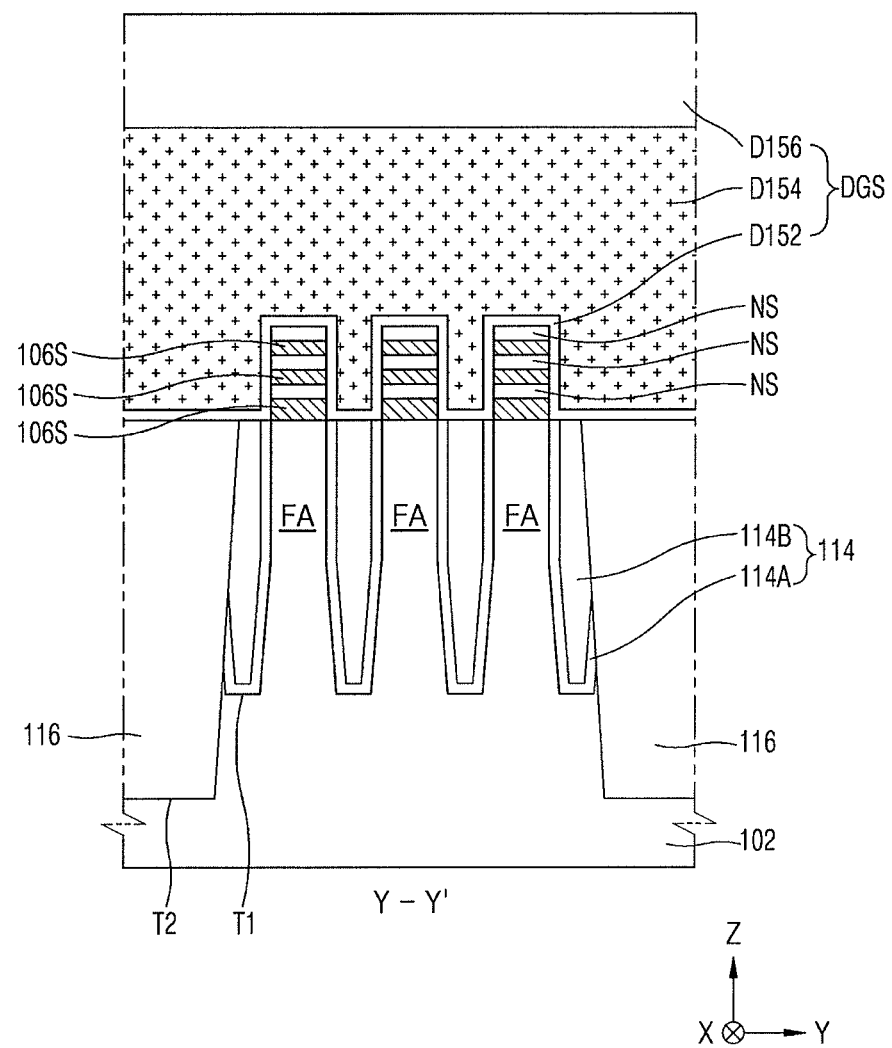

Referring to FIGS. 7A and 7B, a plurality of dummy gate structures DGS may be formed to extend across the plurality of fin-type active areas FA in the fin-type active areas FA. The dummy gate structures DGS may have a structure in which an oxide layer D152, a dummy gate layer D154, and a capping layer D156 are sequentially stacked. In one example of forming the dummy gate structures DGS, the oxide layer D152, the dummy gate layer D154, and the capping layer D156 are sequentially formed to cover an exposed surface of the stack structure of the sacrificing semiconductor layers 106S and the nanosheet semiconductor layers NS covering the fin-type active areas FA, an upper surface of the STI layer 114, and an upper surface of the device isolation layer 116. Then, the oxide layer D152, the dummy gate layer D154, and the capping layer D156 may be patterned such that portions of the oxide layer D152, the dummy gate layer D154, and the capping layer D156 remain as appropriate. The dummy gate structures DGS may be formed to have a planar shape corresponding to a planar shape of gates 150 of FIG. 24A.

In some embodiments, the dummy gate layer D154 may include polysilicon and the capping layer D156 may be a silicon nitride layer. In other embodiments, the dummy gate layer D154 and the capping layer D156 may be formed from different materials.

Figure 8:
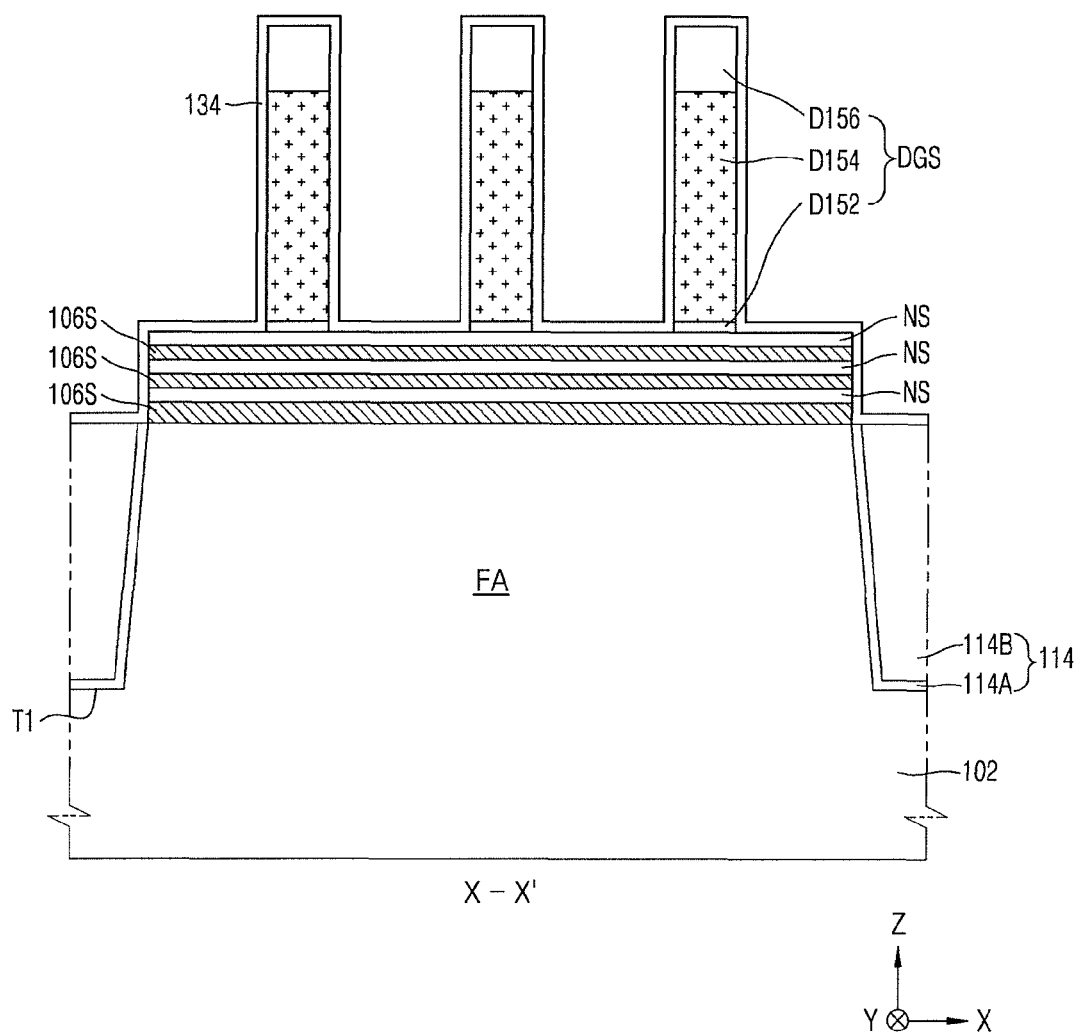

Referring to FIG. 8, an insulating layer 134 covering an exposed surface of the dummy gate structures DGS, the exposed surface of the stack structure of the sacrificing semiconductor layers 106S and the nanosheet semiconductor layers NS, and the upper surfaces of the STI layer 114 and the device isolation layer 116 may be formed. In some embodiments, insulating liner 134 may be a silicon nitride layer. In other embodiments, the insulating liner 134 may be another type of layer.

In some embodiments, after the insulating liner 134 is formed, a halo implantation region may be formed in the nanosheet semiconductor layers NS by implanting impurities ions into the nanosheet semiconductor layers NS. To form the halo implantation region, for example, impurities including boron (B) ions may be implanted into the NMOS transistor region and impurities including phosphor (P) or arsenic (As) ions may be implanted into the PMOS transistor region.

Figure 9:
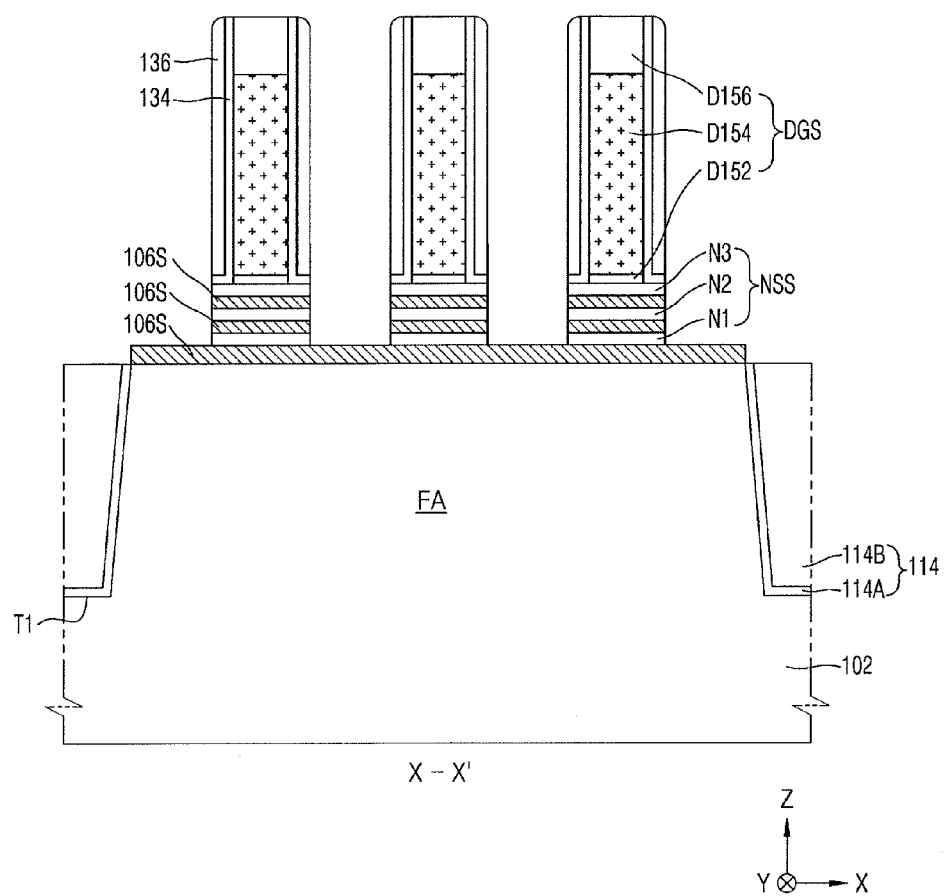

Referring to FIG. 9, first insulating spacers 136 may be formed to cover both side walls of the dummy gate structures DGS and the dummy gate structures DGS. The first insulating spacers 136 may be used as an etch mask to remove part of the stack structure of the sacrificing semiconductor layers 106S and the nanosheet semiconductor layers NS by etching. Thus, nanosheet stack structures NSS including a plurality of nanosheets N1, N2, and N3 may be formed from nanosheet semiconductor layers NS.

Figure 12:
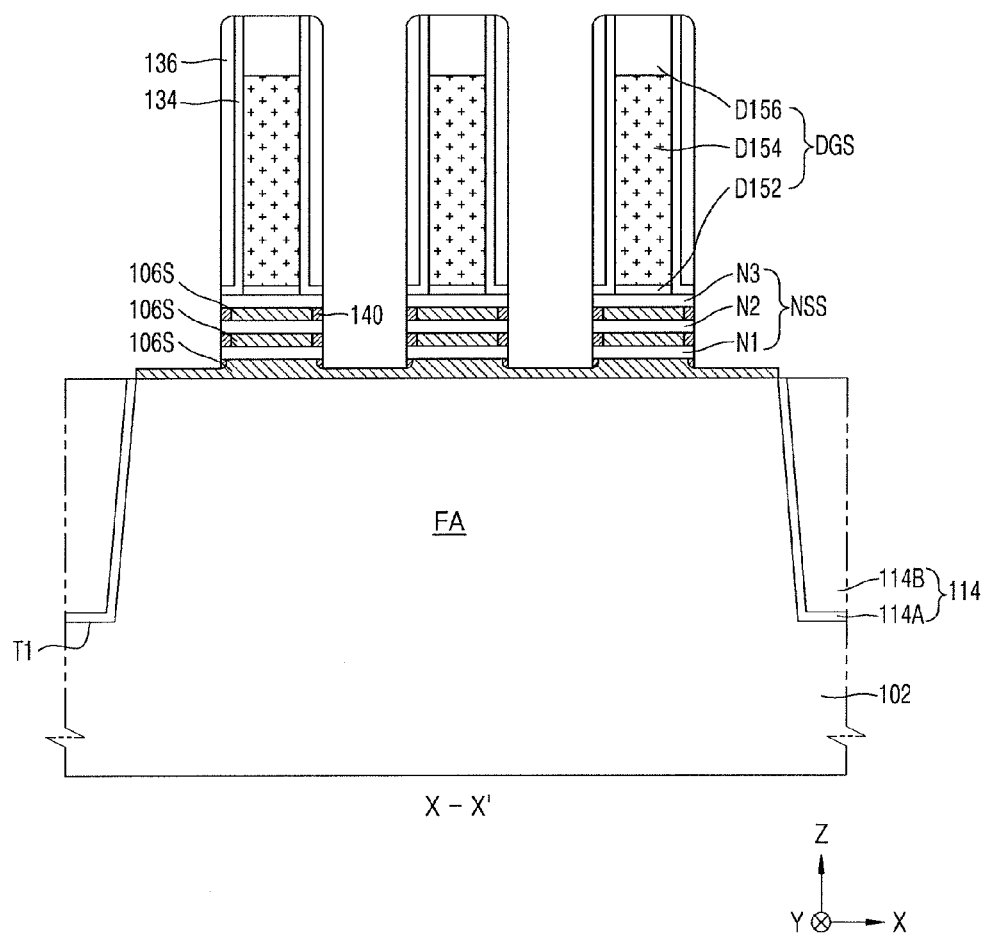

To form the first insulating spacers 136, after a spacer layer including a silicon nitride layer is formed on a resultant structure of FIG. 12 in which the insulating liners 134 are formed, the spacer layer may be etched back again. Thus, the first insulating layers 136 may remain.

When the stack structure of the sacrificing semiconductor layers 106S and the nanosheet semiconductor layers NS is etched, an etching process may be performed by using a time when the lowermost sacrificing semiconductor layer 106S, among the plurality of sacrificing semiconductor layers 106S, is exposed as an etching end time. Accordingly, the nanosheet stack structures NSS are formed and the sacrificing semiconductor layers 106S covering the fin-type active areas FA may be exposed between the nanosheet stack structures NSS. After the nanosheet stack structures NSS are formed, the sacrificing semiconductor layers 106S may remain between the fin-type active areas FA and the nanosheet stack structures NSS and between the nanosheets N1, N2, and N3.

Figure 10:
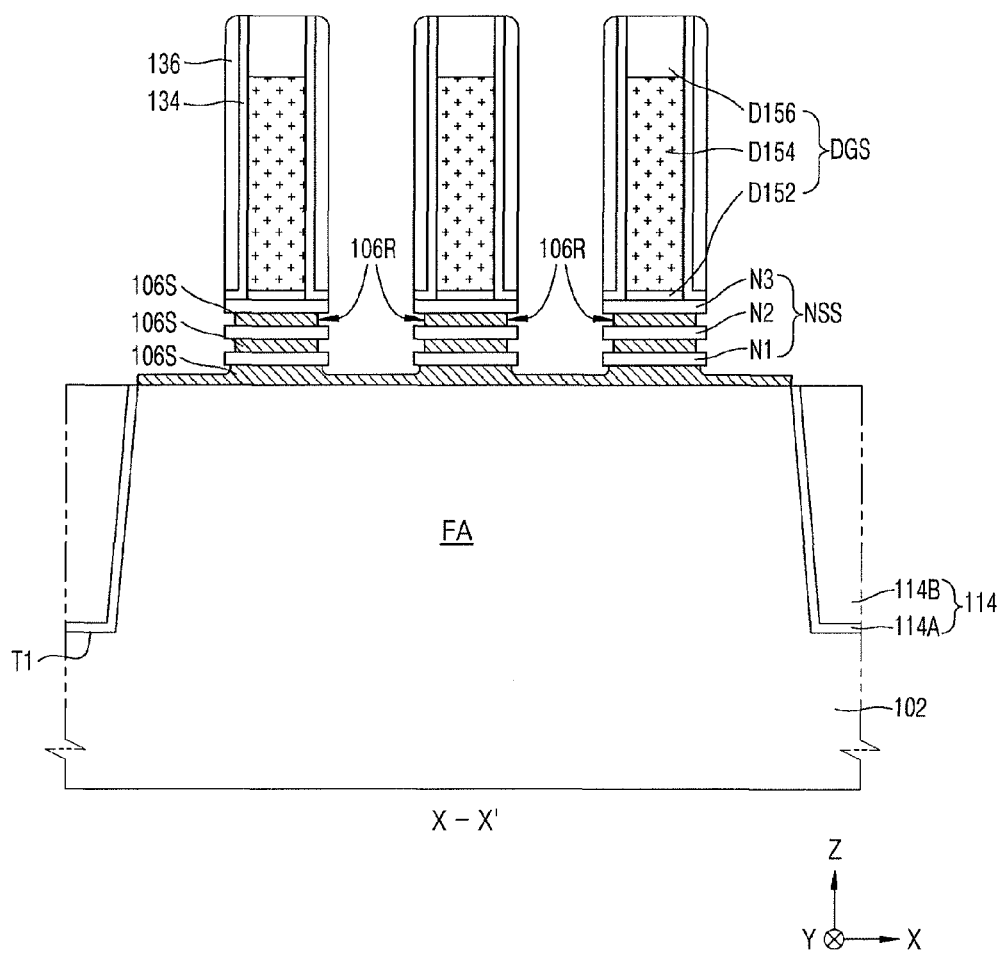

Referring to FIG. 10, recess regions 106R may be formed between the nanosheets N1, N2, and N3, by removing some of the sacrificing semiconductor layers 106S exposed to respective sides of each of the nanosheet stack structures NSS using an isotropic etching process.

Respective sides of the sacrificing semiconductor layers 106S exposed to the recess regions 106R may be, for example, perpendicular to a main surface of the substrate 102. An example will be described with respect to FIGS. 23A to 23Q. In some embodiments, the main surface may be the upper surface 104 of the fin-type active areas FA.

While the recess regions 106R are formed, an upper surface of an exposed part of the lowermost sacrificing semiconductor layer 106S covering the fin-type active regions FA may be partially removed between the nanosheet stack structures NSS. In some embodiments, a lower corner part of the exposed part of the lowermost sacrificing semiconductor layer 106S may have a round shape.

In some embodiments, the isotropic etching process for forming the recess regions 106R may be performed using a wet etching process based on a difference in an etching selectivity between the sacrificing semiconductor layers 106S and the nanosheets N1, N2, and N3.

To form the recess regions 106R, a value of a width of the remaining sacrificing semiconductor layers 106S, after some of the sacrificing semiconductor layers 106S are removed in a horizontal direction, may greater than that of the dummy gate layers D154 in the horizontal direction. For example, a value of a width of the recess regions 106R in the horizontal direction may be less than that of a sum of widths of the insulating liners 134 and the first insulating spacers 136 in the horizontal direction.

Figure 11:
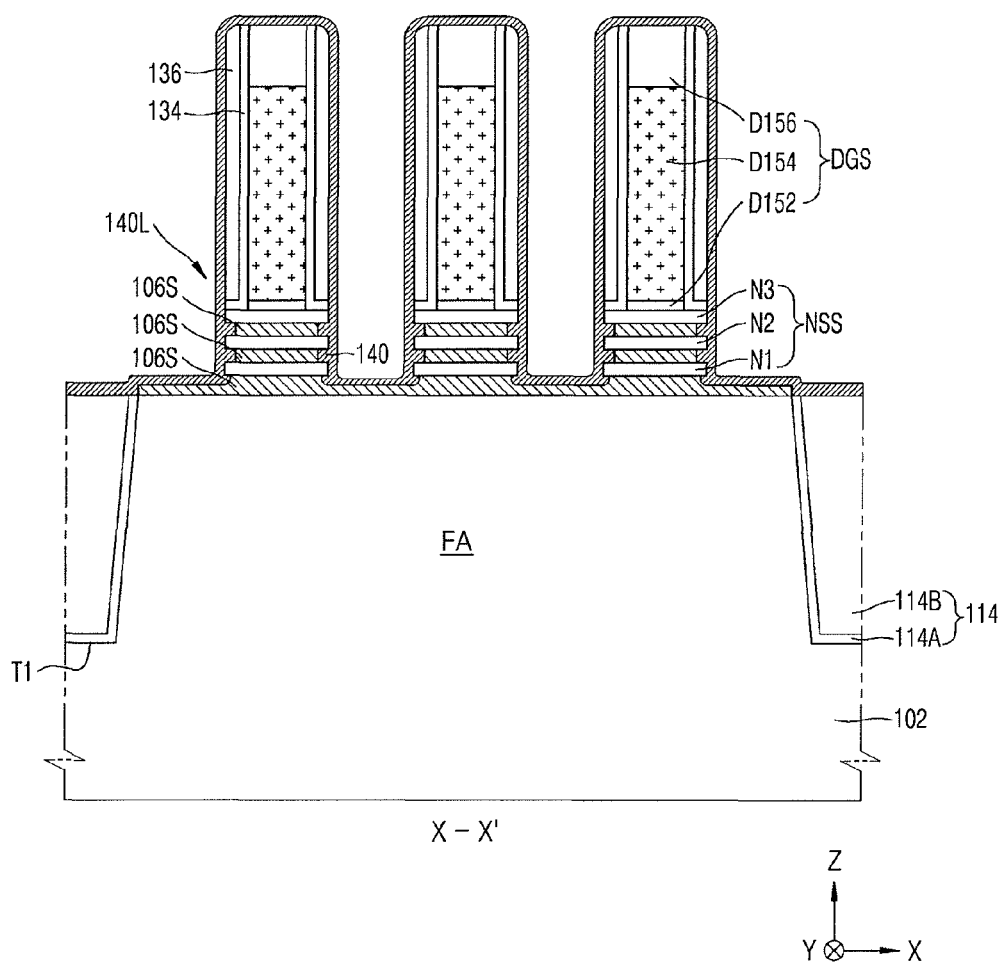

Referring to FIG. 11, an insulating structure 140L may be formed to include a plurality of second insulating spacers 140 filling the recess regions 106R (see, e.g., FIG. 10) formed between the nanosheets N1, N2, and N3. In some embodiments, insulating structure 140L may be a silicon nitride layer. In some embodiments, the insulating structure 140L may include a plurality of insulating layers.

Referring to FIG. 12, a part of the insulating structure 140L (see, e.g., FIG. 11) outside the recess regions 106R (see, e.g., FIG. 10) may be removed. Thus, only the second insulating spacers 140 filling the recess regions 106R may remain. A value of a width of the second insulating spacers 140 in the horizontal direction may be less than that of the sum of widths of the insulating liners 134 and the first insulating spacers 136 in the horizontal direction. Side surfaces of at least one of the second insulating spacers 140 may be, for example, perpendicular to the main surface of the substrate 102. In some embodiments, a lower corner part of the second insulating spacers 140 formed on the lowermost sacrificing semiconductor layer 106S may have a round shape. An example will be described with respect to FIGS. 23A to 23Q.

After the part of the insulating structure 140L of FIG. 11 outside the recess regions 106R (see, e.g., FIG. 10) may be removed, respective side walls of the nanosheets N1, N2, and N3, the second insulating spacers 140, and the lowermost sacrificing semiconductor layer 106S may be exposed.

Figure 13:
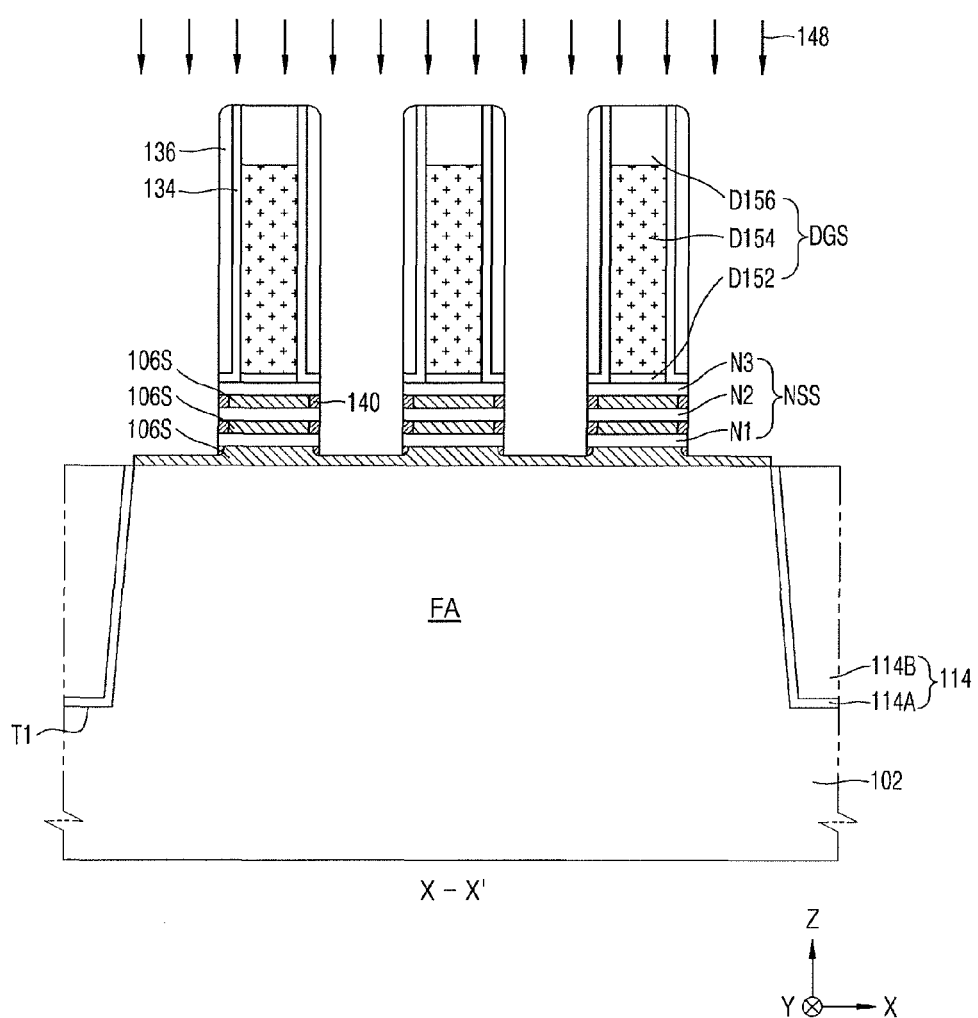

Referring to FIG. 13, the exposed side walls of the nanosheets N1, N2, and N3 and an exposed surface of the lowermost sacrificing semiconductor layer 106S may be exposed to a cleaning atmosphere 148. Thus, a natural oxide layer may be removed from the exposed surfaces.

In some embodiments, a first cleaning process using wet cleaning, a second cleaning process using a SiCoNi™ etching process, and a combination of these may be used as the cleaning atmosphere 148. During the wet cleaning process, for example, diluted HF (DHF), NH₄OH, tetramethyl ammonium hydroxide (TMAH), potassium hydroxide (KOH) solution, etc. may be used. The SiCoNi™ etching process may be performed using, for example, a hydrogen source of ammonia ($NH_3$) and a fluorine source of nitrogen trifluoride ($NF_3$).

During the cleaning process for removing the natural oxide layer, insulating layers constituting the second insulating spacers 140, and in particular, insulating layers exposed to the cleaning atmosphere 148, may include materials having etching tolerance with respect to the cleaning atmosphere 148. This may prevent the second insulating spacer 140 from being consumed while the natural oxide layer is removed under the cleaning atmosphere 148.

Figure 14:
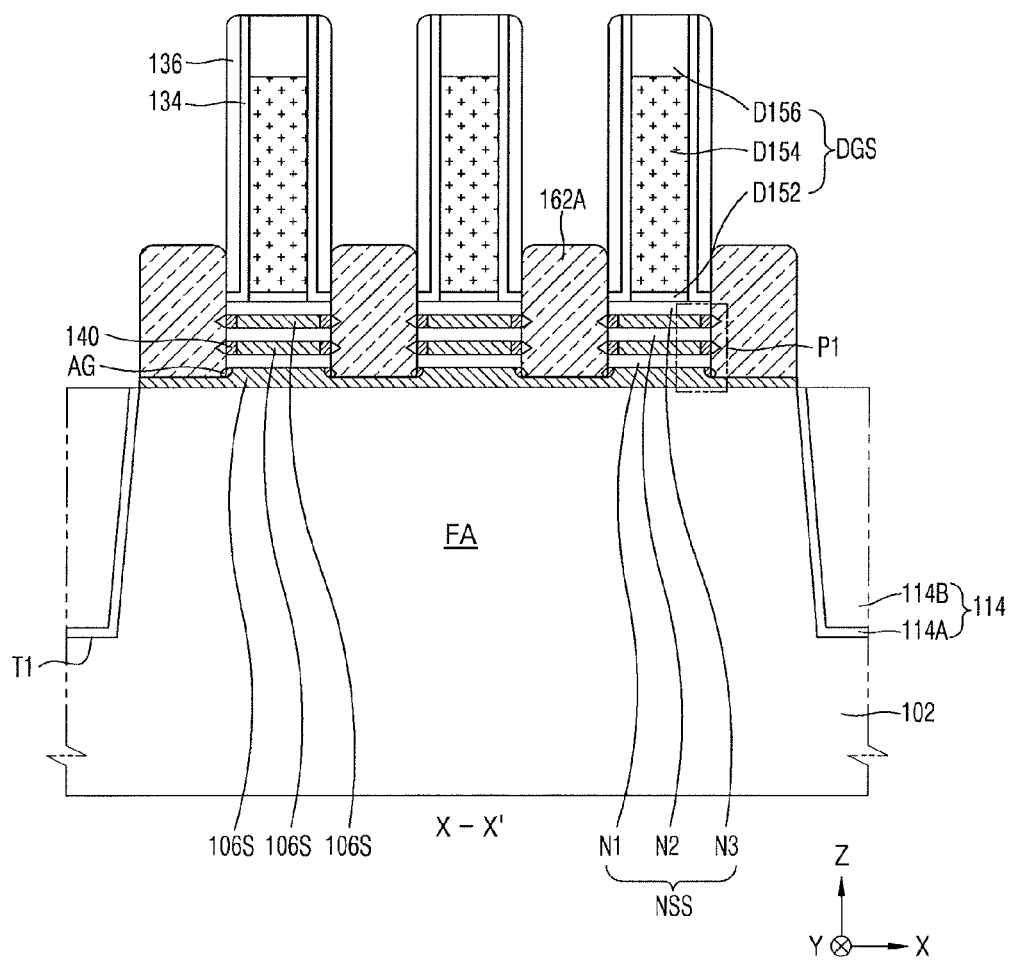
Figure 15A:
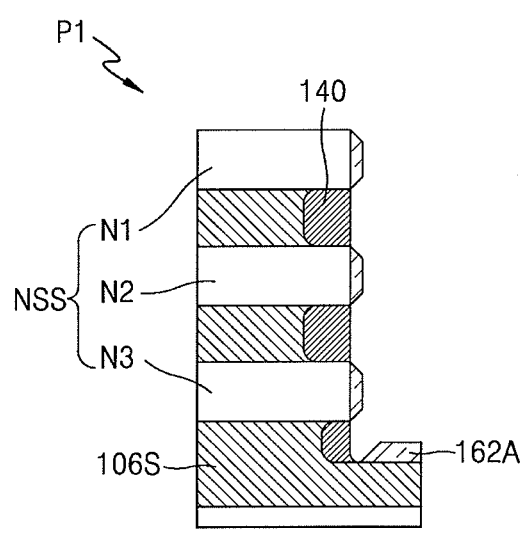
Figure 15B:
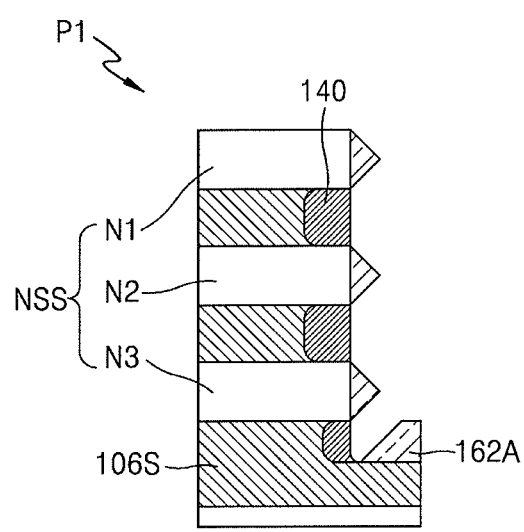
Figure 15C:
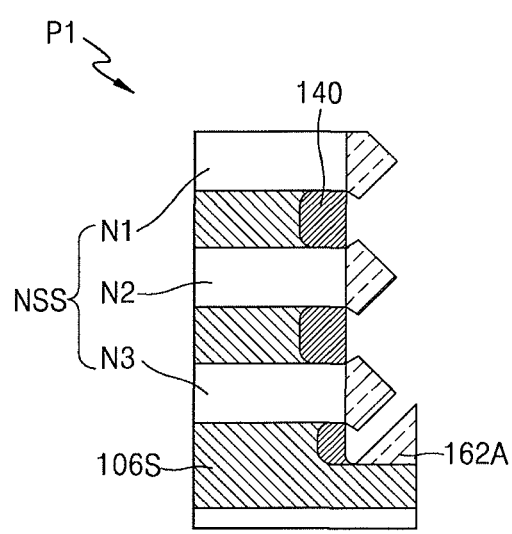
Figure 15D:
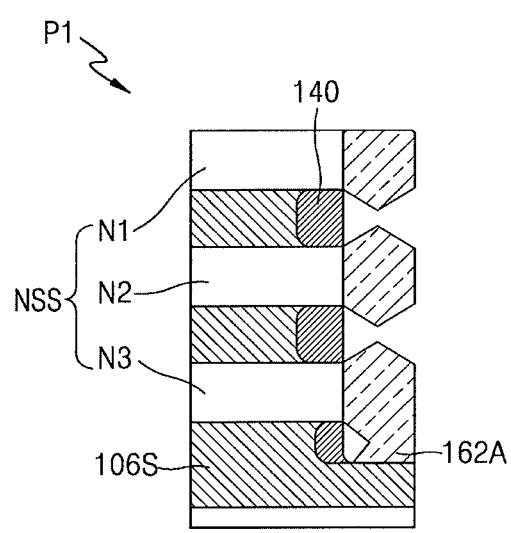
Figure 15E:
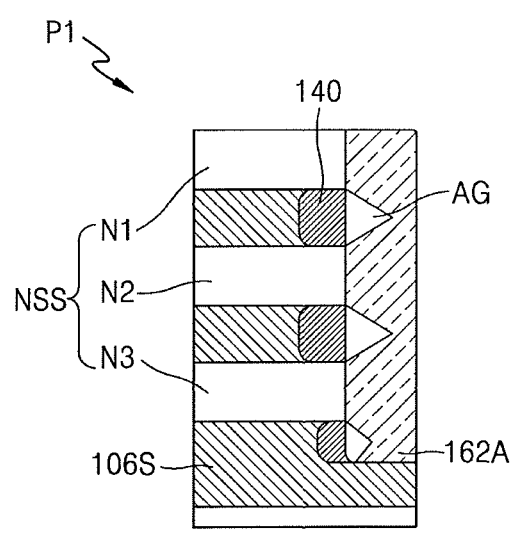

Referring to FIG. 14, semiconductor layers 162A for forming source/drain regions 162 (see FIG. 24B) may be formed by epitaxially growing a semiconductor material from the exposed side walls of the nanosheets N1, N2, and N3 from which the natural oxide layer is removed and the exposed surface of the lowermost sacrificing semiconductor layer 106S.

Surfaces of the first insulating layer spacers 136 and the second insulating spacers 140 may be insulating layers having surfaces that inhibit or prevent seeding and epitaxial growth of semiconductor atoms. Thus, an epitaxial growth process for forming the semiconductor layers 162A may be performed only on the exposed side walls of the nanosheets N1, N2, and N3 and the exposed surface of the lowermost sacrificing semiconductor layer 106S. Therefore, air spaces AG may be formed between the second insulating spacers 140 and the semiconductor layers 162A. An example of a process for forming the air spaces AG will be described with reference to FIGS. 15A through 15E.

FIGS. 15A to 15E are cross-sectional views for describing an example of a process of forming the air spaces AG in the semiconductor device. FIGS. 15A to 15E are enlarged views of a region P1 of FIG. 14.

Referring to FIGS. 15A through 15E, the semiconductor layers 162A may be formed by performing the epitaxial growth process on the exposed side walls of the nanosheets N1, N2, and N3 and the exposed surface of the lowermost sacrificing semiconductor layer 106S. During the epitaxial growth process, if temperature and pressure are adjusted, the semiconductor layers 162A may grow from a crystalline growth surface at a certain angle. The semiconductor layers 162A may also have different growth rates according to growth surface.

Therefore, the semiconductor layers 162A grown from the exposed side walls of the nanosheets N1, N2, and N3 and the exposed surface of the lowermost sacrificing semiconductor layer 106S may not wholly (e.g., at least partially) cover surfaces of the second insulating spacers 140. For example, if parts of the semiconductor layers 162A growing from exposed surfaces of different nanosheets, among the nanosheets N1, N2, and N3, and the exposed surface of the lowermost sacrificing semiconductor layer 106S contact each other, the air spaces AG may be formed between the second insulating spacers 140 and the semiconductor layers 162A.

Figure 16:
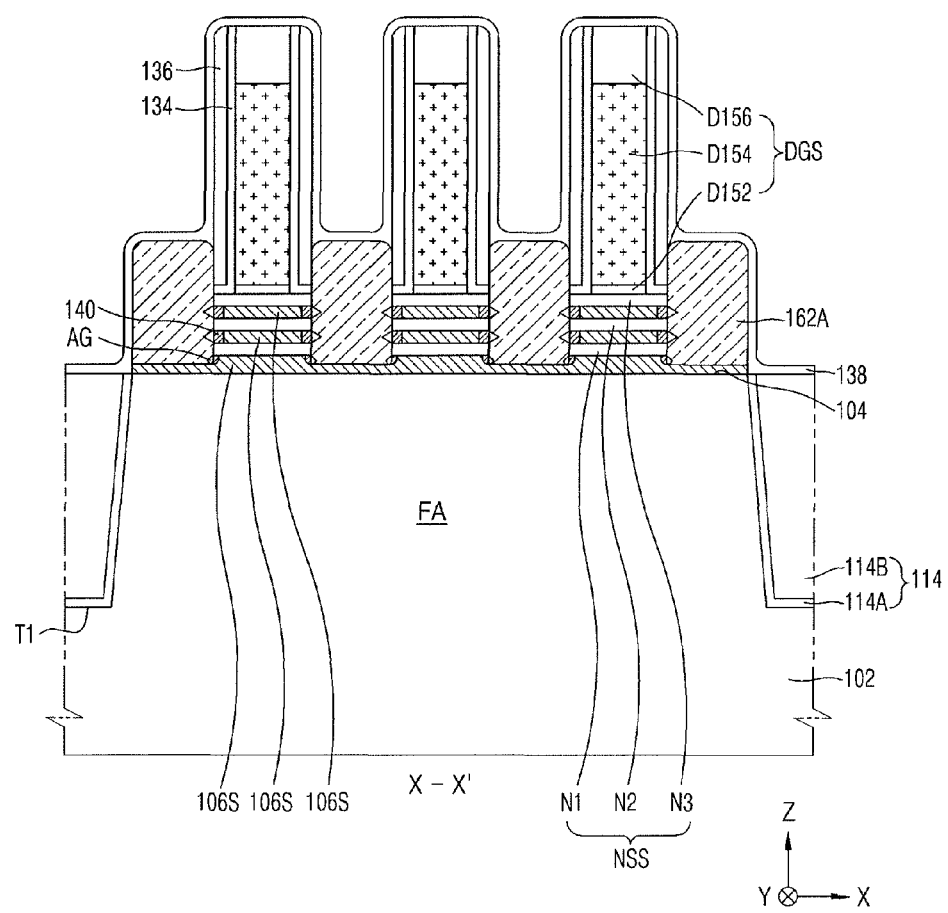

Referring to FIG. 16, a protection layer 138 may be formed to cover a resultant structure in which the semiconductor layers 162A are formed. In some embodiments, the protection layer 138 may be a silicon nitride layer. To form the protection layer 138, an atomic layer deposition (ALD) process or a chemical vapour deposition (CVD) process may be used. In some embodiments, the protection layer 138 may be omitted.

Figure 17:
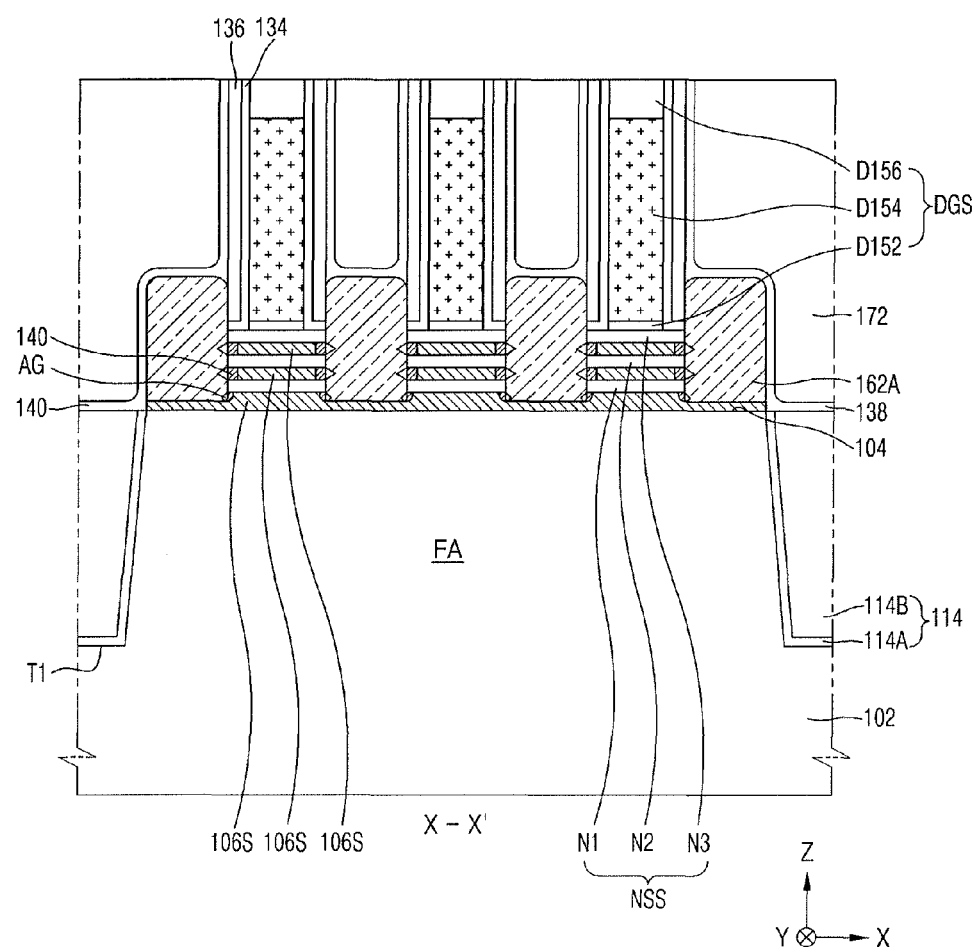

Referring to FIG. 17, an integrate insulating layer 172 may be formed on the protection layer 138. Then, upper surfaces of the capping layers D156 may be exposed by planarizing the integrate insulating layer 172. In some embodiments, the integrate insulating layer 172 may be a silicon oxide layer.

Figure 18:
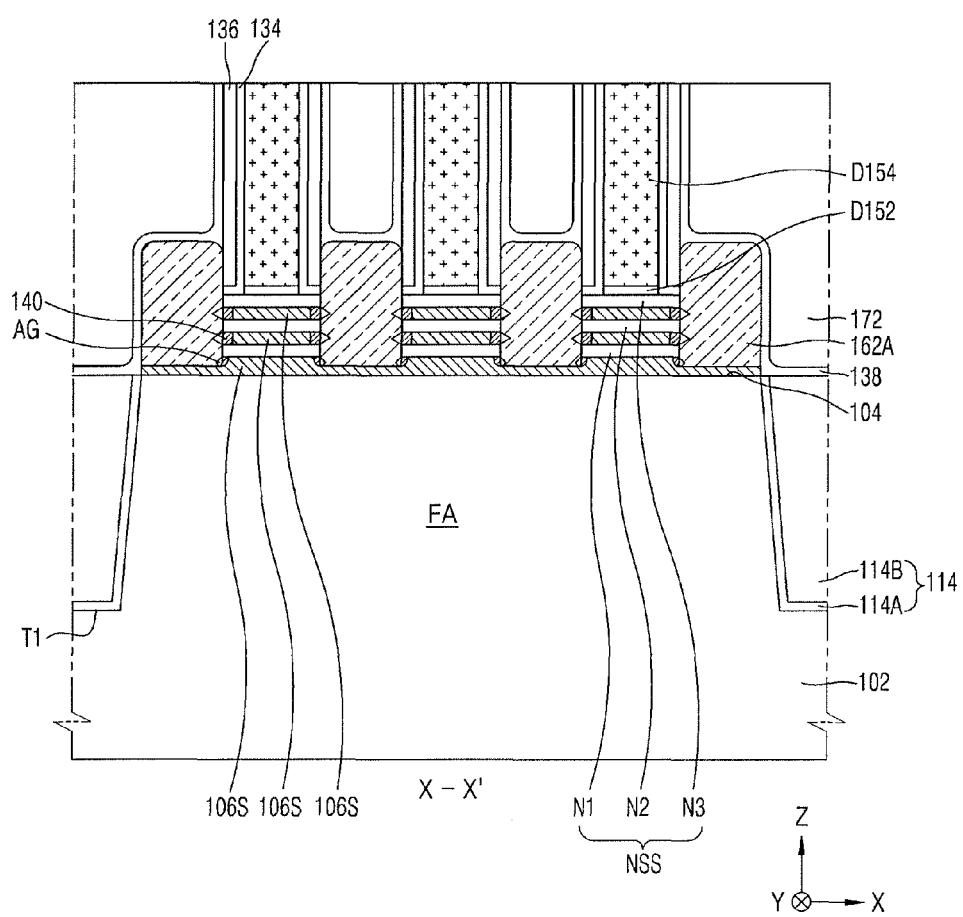

Referring to FIG. 18, the capping layers D156 (see, e.g., FIG. 19) covering upper surfaces of the dummy gate layers D154, the insulating lines 134 around the capping layers D156, the first insulating spacers 136, and the protection layer 138 may be etched back. Also, a partial thickness of an upper portion of the integrate insulating layer 172 may be polished. Thus, an upper surface of the integrate insulating layer 172 may be at the approximately same level as that of upper surfaces of the dummy gate layers D154.

Figure 19:
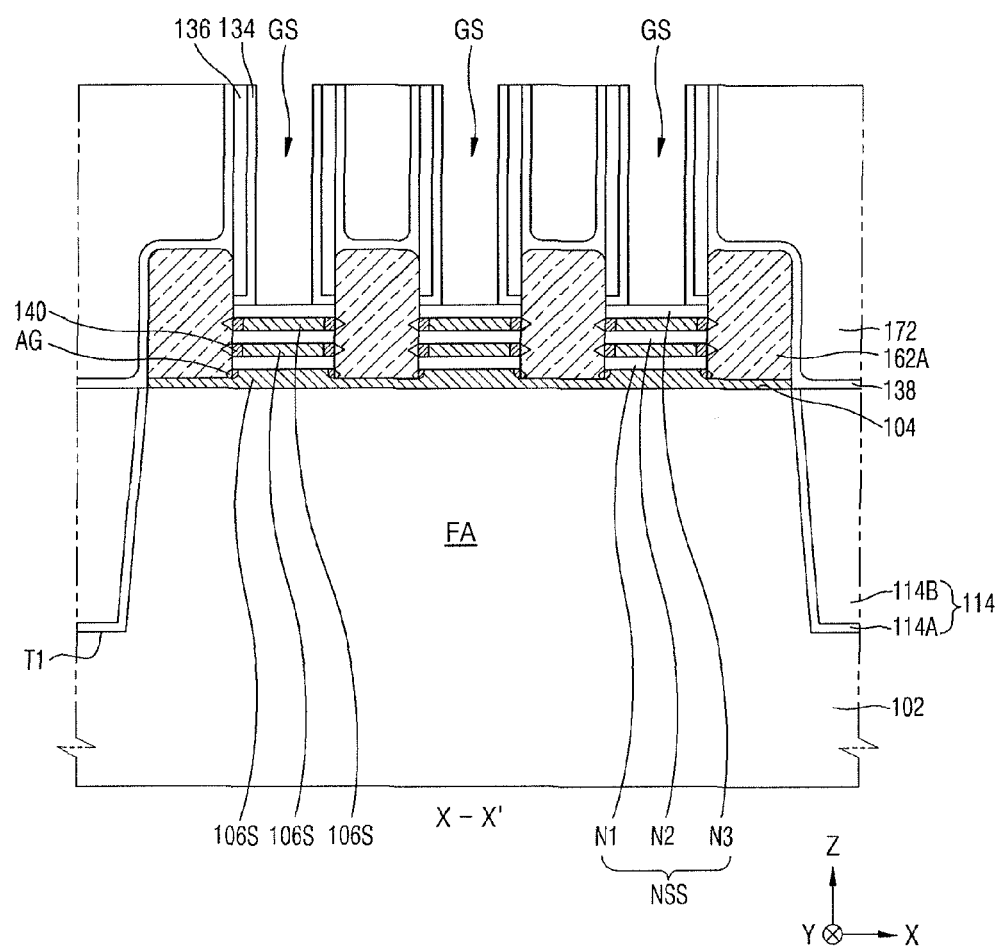

Referring to FIG. 19, the nanosheet N3 may be exposed through gate spaces GS, by removing the dummy gate layers D154 exposed through the integrate insulating layer 172 and the oxide layers D152 below the dummy gate layers D154.

Figure 20:
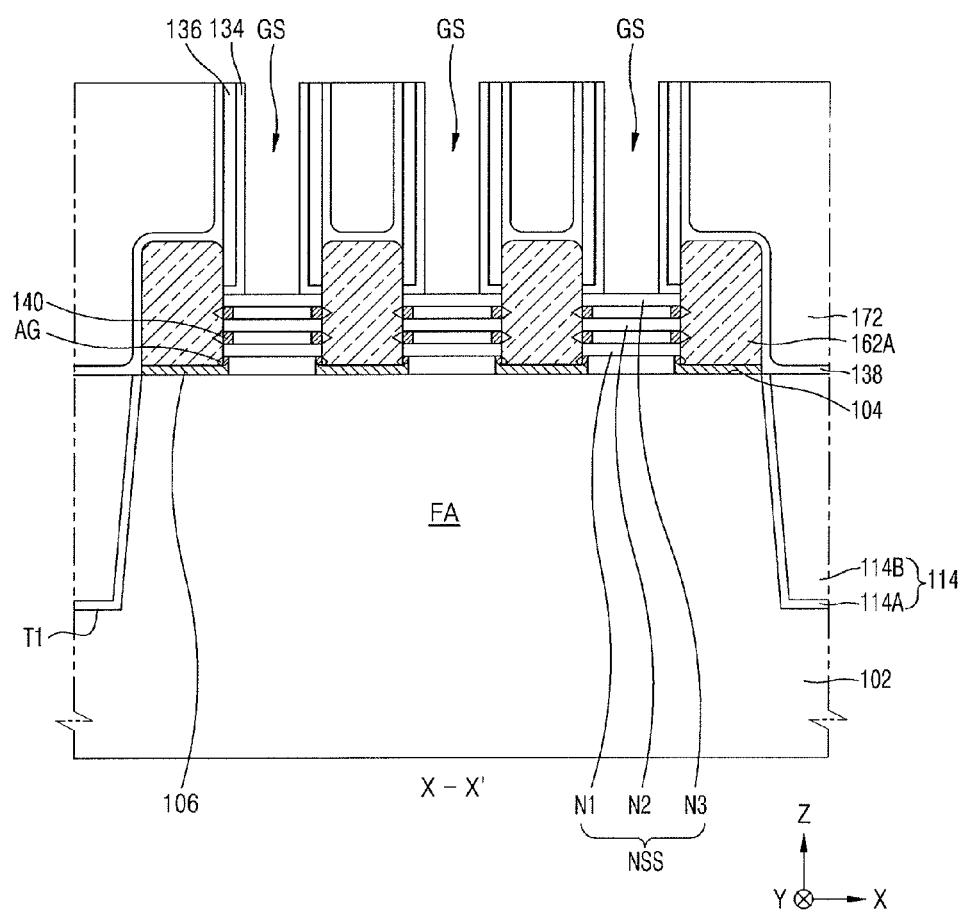

Referring to FIG. 20, the nanosheets N1, N2, and N3 and the upper surface 104 of each of the fin-type active areas FA may be partially exposed through the gate spaces GS, by removing some of the sacrificing semiconductor layers 106S (see, e.g., FIG. 19) remaining on the fin-type active areas FA through the gate spaces GS.

The lowermost sacrificing semiconductor layer 106S may not be completely removed. Some of the sacrificing semiconductor layers 106S may remain on the fin-type active areas FA in lower portions of the second insulating spacers 140. Some of the sacrificing semiconductor layers 106S remaining on the fin-type active areas F may constitute a buffer semiconductor layer 106.

Figure 21:
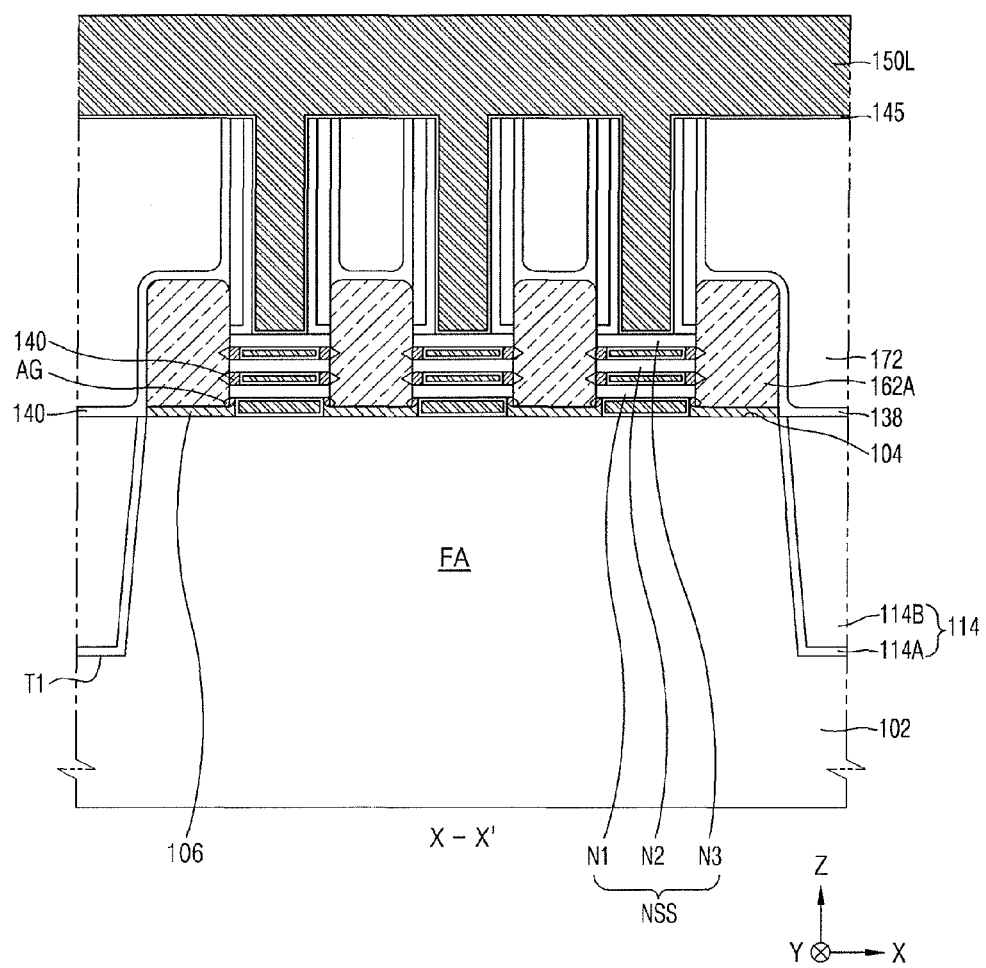

Referring to FIG. 21, after the natural oxide layer is removed from the exposed surfaces of the nanosheets N1, N2, and N3 and the fin-type active areas FA, a gate dielectric layer 145 may be formed on exposed surfaces of the gate spaces GS (see, e.g., FIG. 20). Also, a gate forming conductive layer 150L may be formed on the gate dielectric layer 145 to cover the integrate insulating layer 172 while filing the gate spaces GS.

The gate dielectric layer 145 may have a stack structure of an interfacial layer and a high dielectric layer. The interfacial layer may act to repair an interface defect between the interfacial layer and the high dielectric layer on upper surfaces of the fin-type active areas FA and surfaces of the nanosheets N1, N2, and N3. In some embodiments, the interfacial layer may include a low dielectric material layer having a dielectric constant below about a predetermined level (e.g., 9). Examples include a silicon oxide layer, a silicon oxynitride layer, or a combination of these.

In other some embodiments, the interfacial layer may include silicate, a combination of silicate and a silicon oxide layer or a combination of silicate and a silicon oxynitride layer. In some embodiments, the interfacial layer may be omitted.

The high dielectric layer may include a material having a dielectric constant greater than that of the silicon oxide layer. For example, the high dielectric layer may have a dielectric constant ranging from about 10 to about 25. The high dielectric layer may include, for example, a material selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof. The high dielectric layer may be formed through an ALD process, a CVDP process, or a physical vapour deposition (PVD) process. The high dielectric layer may have a thickness ranging, for example, from about 10 to about 40 Å.

The gate forming conductive layer 150L may include a metal containing layer for adjusting a work function and a metal containing layer for filling a gap filling an upper space of the metal containing layer for adjusting the work function. In some embodiments, the gate forming conductive layer 150L may have a structure in which a metal nitride layer, a metal layer, a conductive capping layer, and a gap-fill metal layer are sequentially stacked. Each of the metal nitride layer and the metal layer may include, for example, at least one metal selected from Ti, W, Ru, Nb, Mo, Hf, Ni, Co, Pt, Yb, Tb, Dy, Er, or Pd. Each of the metal nitride layer and the metal layer may be formed through an ALD process, a metal organic ALD (MOALD) process, or a metal organic CVD (MOCVD) process.

The conductive capping layer may act as a protection layer preventing a surface of the metal layer from being oxidized. The conductive capping layer may act as a wetting layer for facilitating deposition when another conductive layer is deposited on the metal layer. The conductive capping layer may include, for example, metal nitride, for example, TiN, TaN, or a combination of these.

The gap-fill metal layer may extend on the conductive capping layer. The gap-fill metal layer may be, for example, a W layer. The gap-fill metal layer may be formed through the ALD process, the CVD process, or the PVD process. The gap-fill metal layer may bury a recess space formed in an upper surface of the conductive capping layer by a stepped part without a void. In some embodiments, the gate forming conductive layer 150L may have a TiAlC/TiN/W stack structure, a TiN/TaN/TiAlC/TiN/W stack structure, or a TiN/TaN/TiN/TiAlC/WiN/W stack structure. In these structures, a TiAlC layer or a TiN layer may act as the metal containing layer for adjusting work function.

Figure 22:
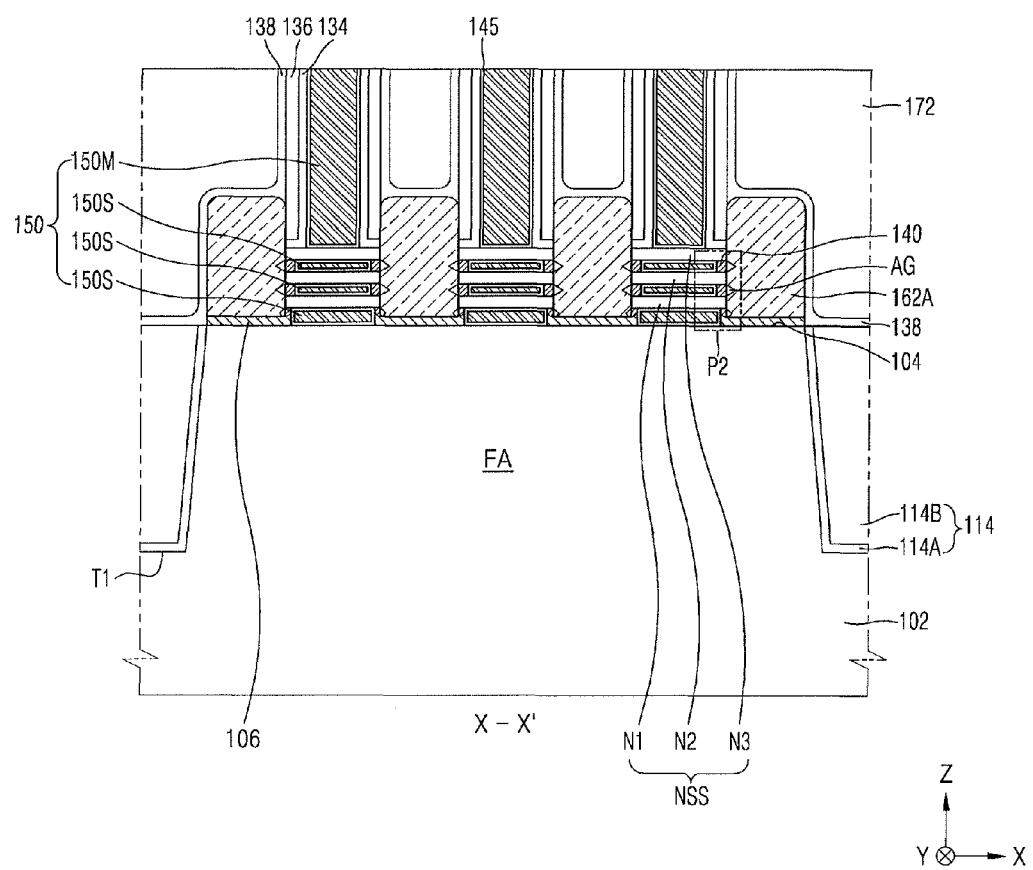

Referring to FIG. 22, gates 150 filling the gate spaces GS may be formed by removing a part of an upper surface of the gate forming conductive layer 150L (see, e.g., FIG. 21) until an upper surface of the integrate insulating layer 172 is exposed. Each of the gates 150 may include a main gate portion 150M covering the nanosheet stack structure NSS including the nanosheets N1, N2, and N3 and a plurality of sub gate portions 150S connected to the main gate portion 150M and formed in spaces between the nanosheets N1, N2, and N3 and the fin-type active areas FA. A value of a length of each of the sub gate portions 150S in a horizontal direction may be greater than that of the main gate portion 150M in the horizontal direction.

The plurality of second insulating spacers 140 may be on respective sides of each of the sub gate portions 150S, with the gate dielectric layer 145 therebetween. The air spaces AG may be formed between each of the second insulating spacers 140 and the semiconductor layer 162A.

Figure 23A:
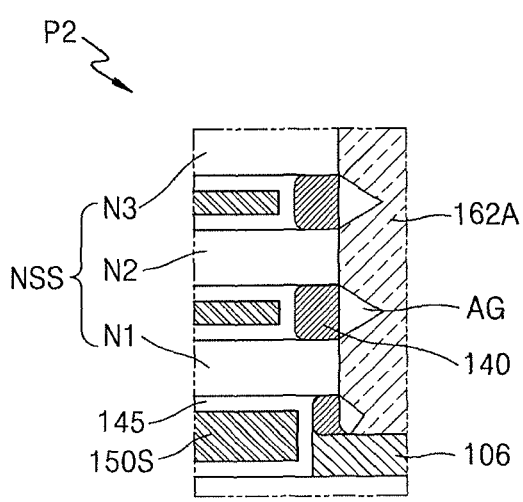
FIGS. 23A-23Q illustrate embodiments of air spaces in a semiconductor device.
Figure 23B:
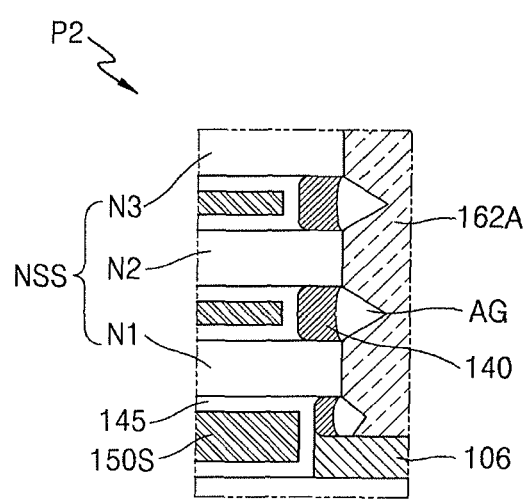
Figure 23C:
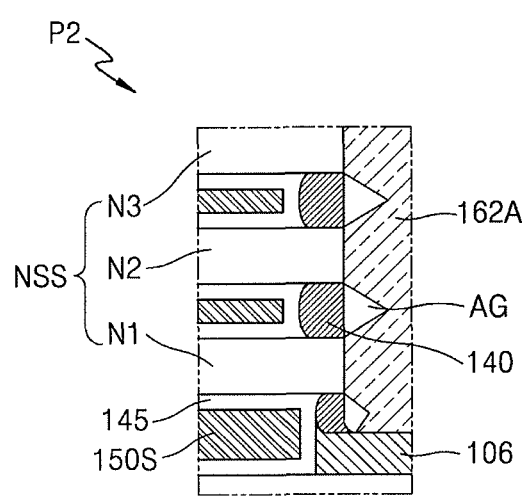
Figure 23D:
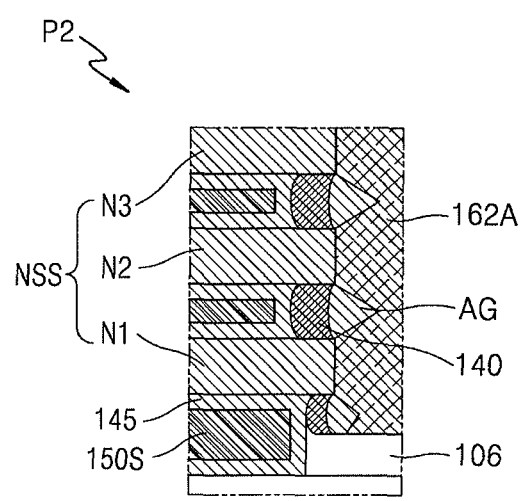
Figure 23E:
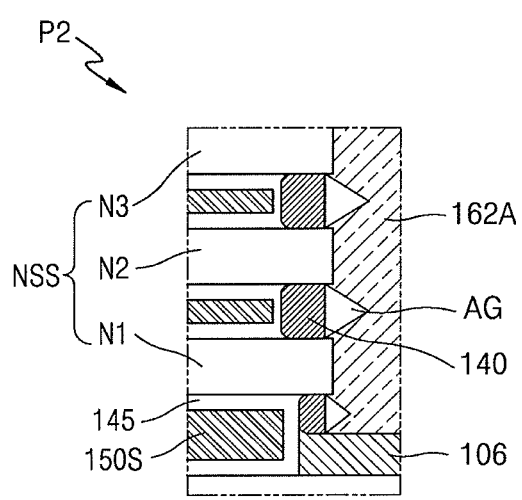
Figure 23F:
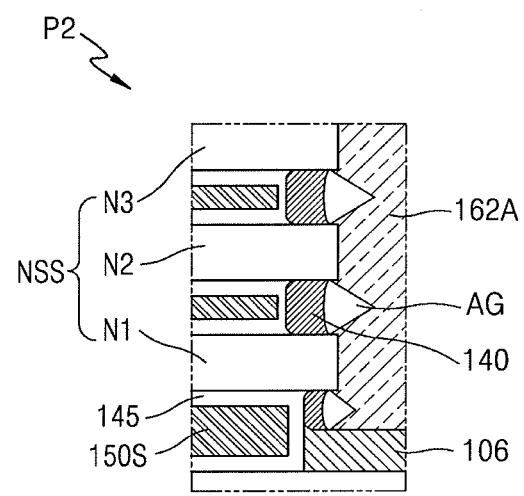
Figure 23G:
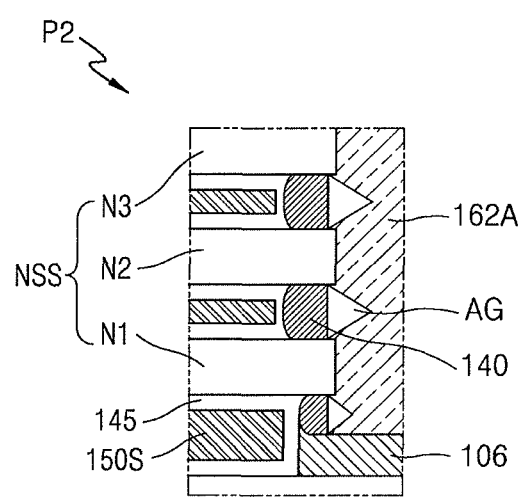
Figure 23H:
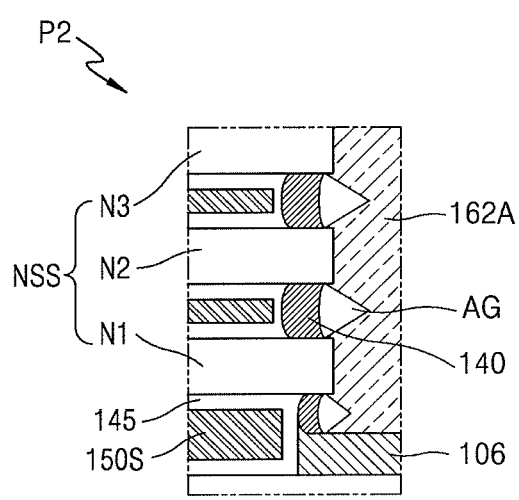
Figure 23I:
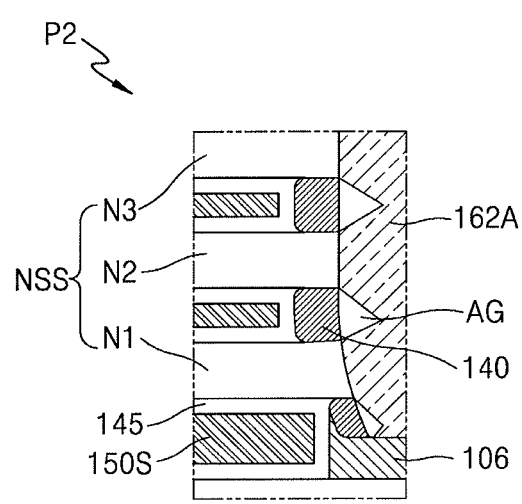
Figure 23J:
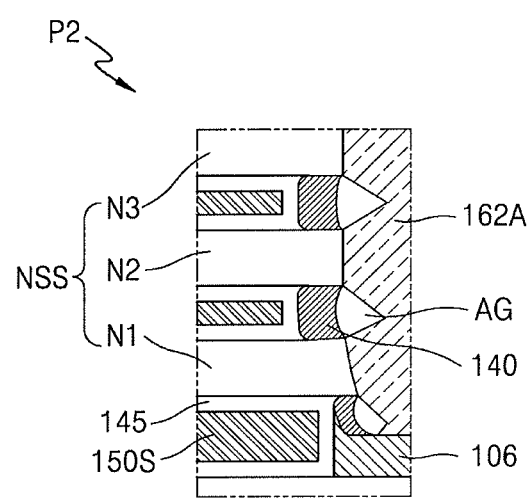
Figure 23K:
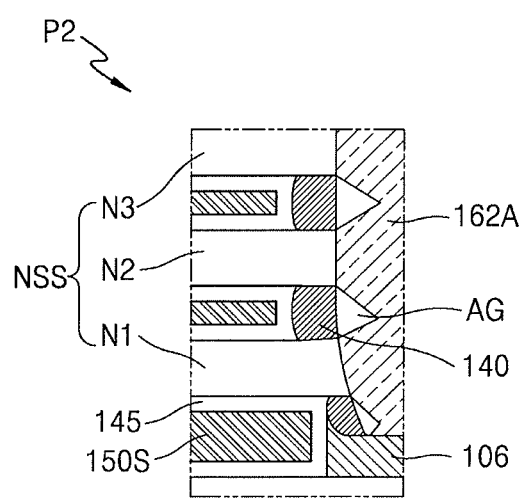
Figure 23L:
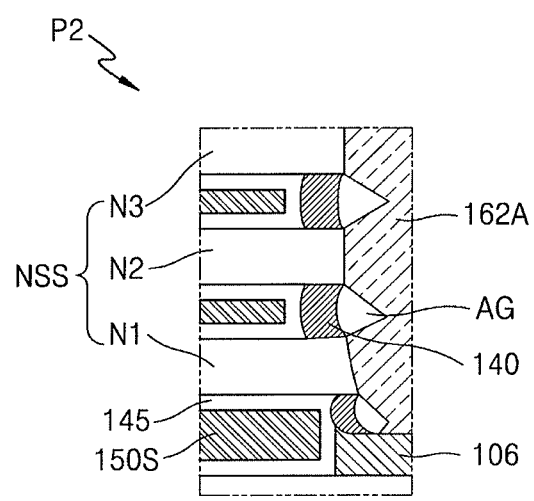
Figure 23M:
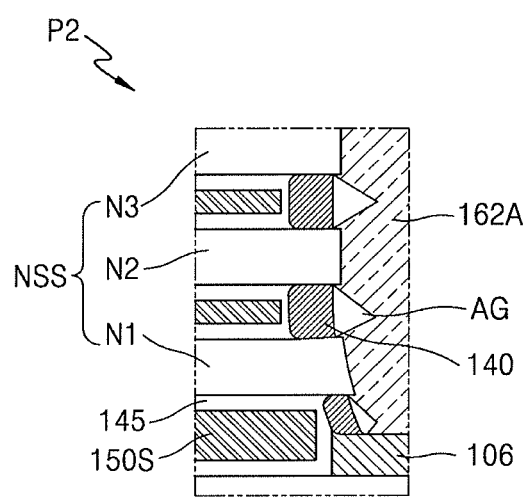
Figure 23N:
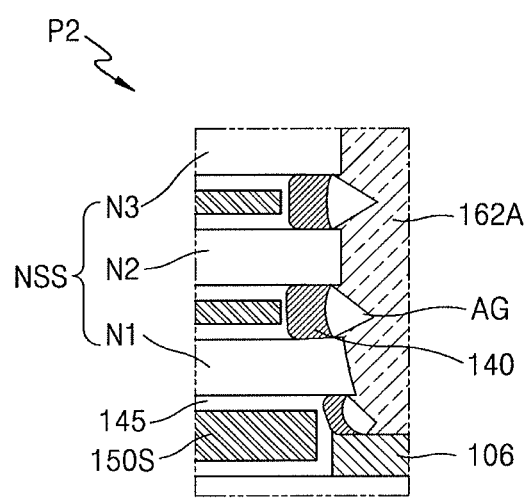
Figure 230:
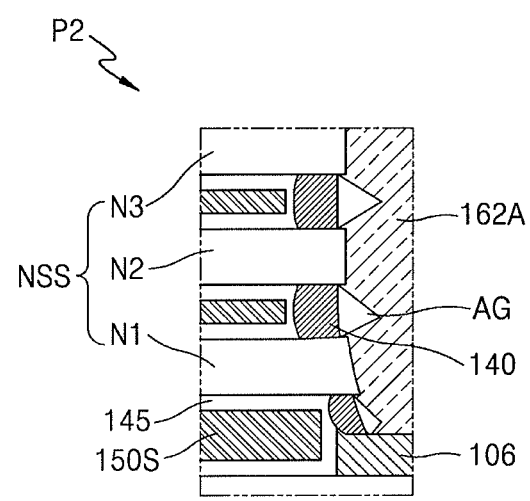
Figure 23P:
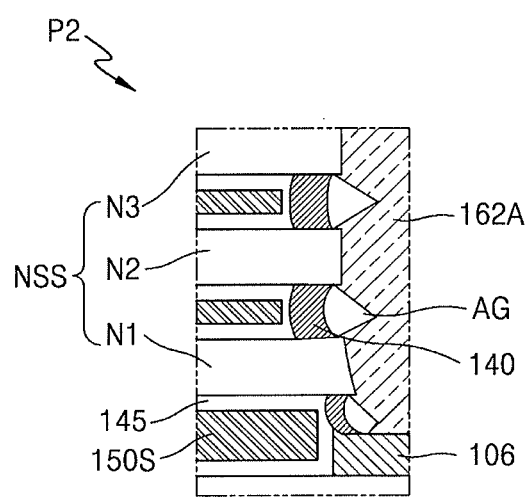
Figure 23Q:
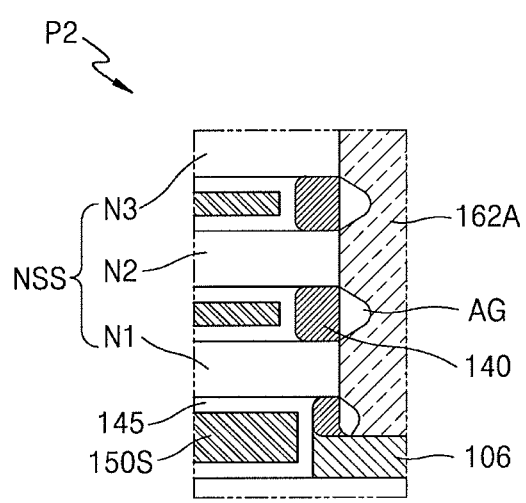

FIGS. 23A to 23Q are cross-sectional views of examples of various air spaces in a semiconductor device. FIGS. 23A to 23Q are enlarged views of a region P2 of FIG. 22.

Referring to FIG. 23A, the air spaces AG may extend while reducing widths with respect to a main surface of a substrate (102 of FIG. 22) in a vertical direction (Z direction) from the second insulating spacers 140 to the semiconductor layers 162A in an opposite direction to a direction of the sub gate portions 150S. The air spaces AG may have a triangular cross-section having apexes in an upper side and a lower side of side surfaces of the second insulating spacers 140 and the semiconductor layers 162A.

The at least one air space AG among the plurality of air spaces AG disposed between each of the second insulating spacers 140 and the semiconductor layers 162A may have a unit cross-section different from that of the air space AG at a different level with respect to the main surface of the substrate (102 of FIG. 22) on an X-Z plane. A size of a unit cross-section of the air spaces AG on the X-Z plane may be proportional to a vertical height of each of the second insulating spacers 140 corresponding to the air spaces AG in a Z direction. For example, when a vertical height of the lowermost second insulating spacer 140 is less than those of the other second insulating spacers 140, a value of a unit cross-section of the lowermost air space AG may be less than that of the other air spaces AG. Thus, a value of a volume of the lowermost air space AG may be less than that of the other air spaces AG.

The vertical height of the lowermost second insulating spacer 140 may be determined according to a height of a part of the lowermost sacrificing semiconductor layer 106S removed during an isotropic etching process described with reference to FIG. 10. Thus, in some embodiments, the value of the unit cross-section of the lowermost air space AG may be the same as or greater than that of the other air spaces AG.

Referring to FIG. 23B, the air spaces AG may extend while reducing widths from the second insulating spacers 140 to the semiconductor layers 162A in a direction opposite to the direction of the sub gate portions 150S. The air spaces AG may have a fan-shaped cross-section with an apex in the semiconductor layers 162A or a triangular cross-section having one side pointing toward the second insulating spacers 140.

During a process of removing a part of the insulating structure 140L (see, e.g., FIG. 11) for forming the second insulating spacers 140 described with reference to FIG. 12, when the insulating structure 140L is relatively over-etched, outer side walls of the second insulating spacers 140 may have a concave shape. In this case, the air spaces AG may bulgingly protrude toward the second insulating spacers 140.

Referring to FIG. 23C, the second insulating spacers 140 may have side walls bulging toward the sub gate portions 150S. During an isotropic etching process of forming the recess regions 106R described with reference to FIG. 10, side walls of the sacrificing semiconductor layers 106S may be inwardly concave so that the recess regions 106R may have a bulging shape toward the sacrificing semiconductor layers 106S. In this case, the second insulating spacers 140 formed in the recess region 106R may have side walls bulging toward the sub gate portions 150S.

Referring to FIG. 23D, during the isotropic etching process of forming the recess regions 106R described with reference to FIG. 10, the side walls of the sacrificing semiconductor layers 106S may be inwardly concave, so that the recess regions 106R may have the bulging shape toward the sacrificing semiconductor layers 106S.

During the process of removing the part of the insulating structure 140L (see, e.g., FIG. 11) for forming the second insulating spacers 140 described with reference to FIG. 12, when the insulating structure 140L is relatively over-etched, the outside walls of the second insulating spacers 140 may have the concave shape. In this case, inner side surfaces of the second insulating spacers 140 toward the sub gate portions 150S may have the bulging shape, and the outer side walls of the second insulating spacers 140 toward the air spaces AG may have a shape similar to a crescent moon having the concave shape. Therefore, the air spaces AG may have the fan-shaped cross-section with an apex in the semiconductor layers 162A or the triangular cross-section having one side pointing toward the second insulating spacers 140.

Referring to FIGS. 23E to 23H, the outer side walls of the second insulating spacers 140 toward the air spaces AG may be inwardly shifted from respective side walls of the nanosheets N1, N2, and N3. For example, a shape of each of the second insulating spacers 140 in FIGS. 23E to 23H may be similar to the shape of each of the second insulating spacers 140 of FIGS. 23A to 23D. Locations of the second insulating spacers 140 may be inwardly shifted from respective side walls of nanosheets N1, N2, and N3.

For example, during the process of removing the part of the insulating structure 140L (see, e.g., FIG. 11) for forming the second insulating spacers 140 described with reference to FIG. 12, the insulating structure 140L may be relatively over-etched. The outer side walls of the second insulating spacers 140 toward the air spaces AG may be inwardly shifted from respective side walls of the nanosheets N1, N2, and N3. Thus, each of the second insulating spacers 140 of FIGS. 23E to 23H may be formed. A method of forming the shape of each of the second insulating spacers 140 of FIGS. 23E to 23H may be similar to that of the shape of each of the second insulating spacers 140 of FIGS. 23A to 23D.

A shape of the air spaces AG in FIGS. 23E to 23H is similar to that of the air spaces AG in FIGS. 23A to 23D, except that the air spaces AG in FIGS. 23E to 23H are shifted between the nanosheets N1, N2, and N3, e.g., toward the sub gate portions 150S.

Referring to FIG. 23I to 23P, the second insulating spacers 140 and the air spaces AG may have different shapes according to a distance from the main surface of the substrate 102. To form the nanosheet stack structures NSS including the nanosheets N1, N2, and N3 described with reference to FIG. 9, an etch process of part of a stack structure of the sacrificing semiconductor layers 106S and the nanosheet semiconductor layers NS is performed. A width of the nanosheet stack structures NSS may increase closer to the substrate 102. Thus, the second insulating spacers 140 may have a vertical shape relatively farther away from the substrate 102 and may have an inclined shape relatively closer to the substrate 102.

In this case, a cross-section of the air space AG relatively far away from the substrate 102 may have an equilateral triangular shape, in which lengths of respective sides of the semiconductor layer 162A are the same or similar. A cross-section of the air space AG relatively close to the substrate 102 may have different lengths of respective sides of the semiconductor layer 162A. In some embodiments, a ratio of the lengths of respective sides of the semiconductor layer 162A of the air spaces AG may increase relatively closer to the substrate 102. In some embodiments, a length of one side toward the substrate 102, among the lengths of respective sides of the semiconductor layer 162A of the air space AG relatively close to the substrate 102, may be relatively small.

A shape of respective side walls of each of the second insulating spacers 140 and a shape of the air spaces AG of FIGS. 23I to 23P are similar to that of respective side walls of each of the second insulating spacers 140 and the shape of the air spaces AG of FIGS. 23A to 23H except for the above-described difference.

Referring to FIG. 23Q, a side opposite to side surfaces of the second insulating spacers 140, e.g. apexes of air spaces AG extending to the semiconductor layers 162A may have a round shape. During an epitaxial growth process to form the semiconductor layers 162A described with reference to FIGS. 14 to 15E, if temperature and pressure are adjusted, the apexes of the air spaces AG extending to the semiconductor layers 162A may have the round shape.

Although one apex of the air spaces AG of FIG. 23A has the round shape in FIG. 23Q, one apex of the air spaces AG of FIGS. 23B to 23P may also have the round shape in some embodiments.

Figure 24A:
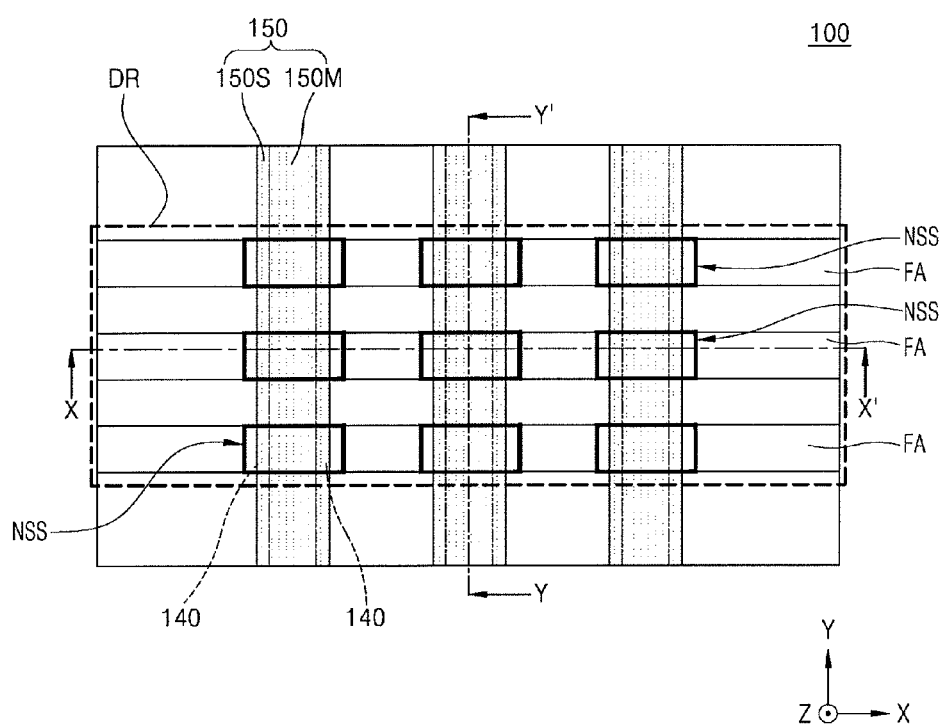
FIGS. 24A-24C illustrate another embodiment of a semiconductor device.
Figure 24B:
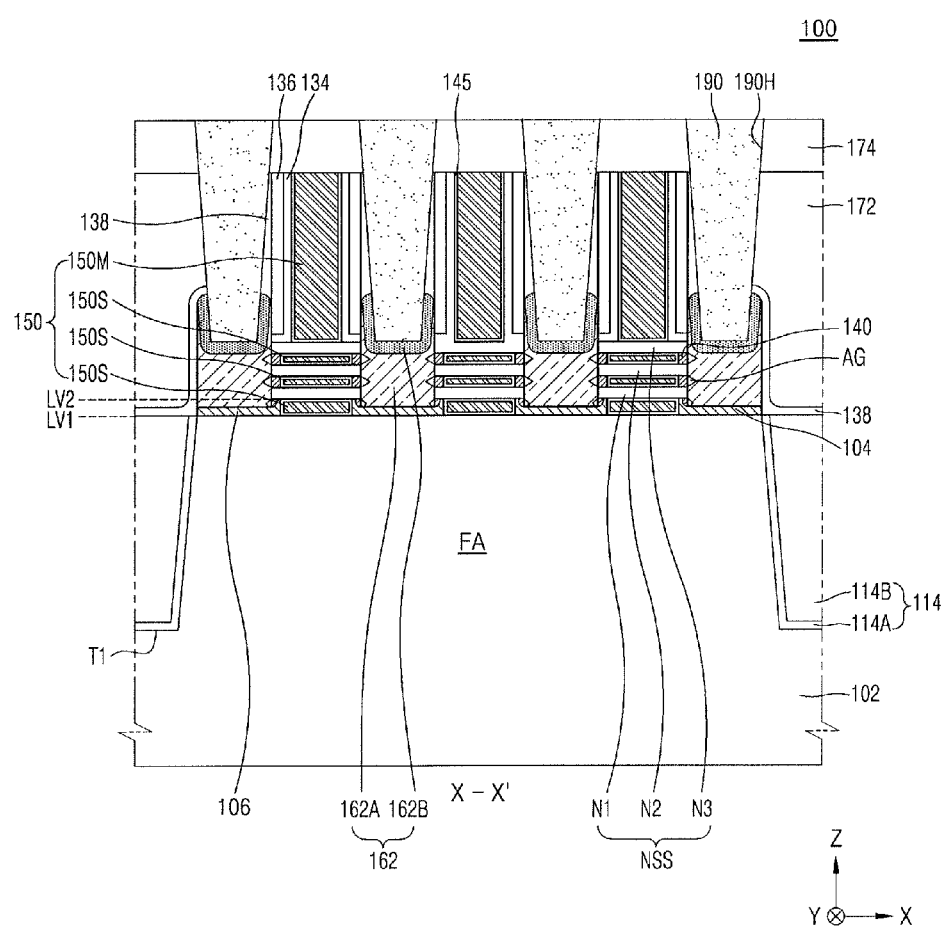
Figure 24C:
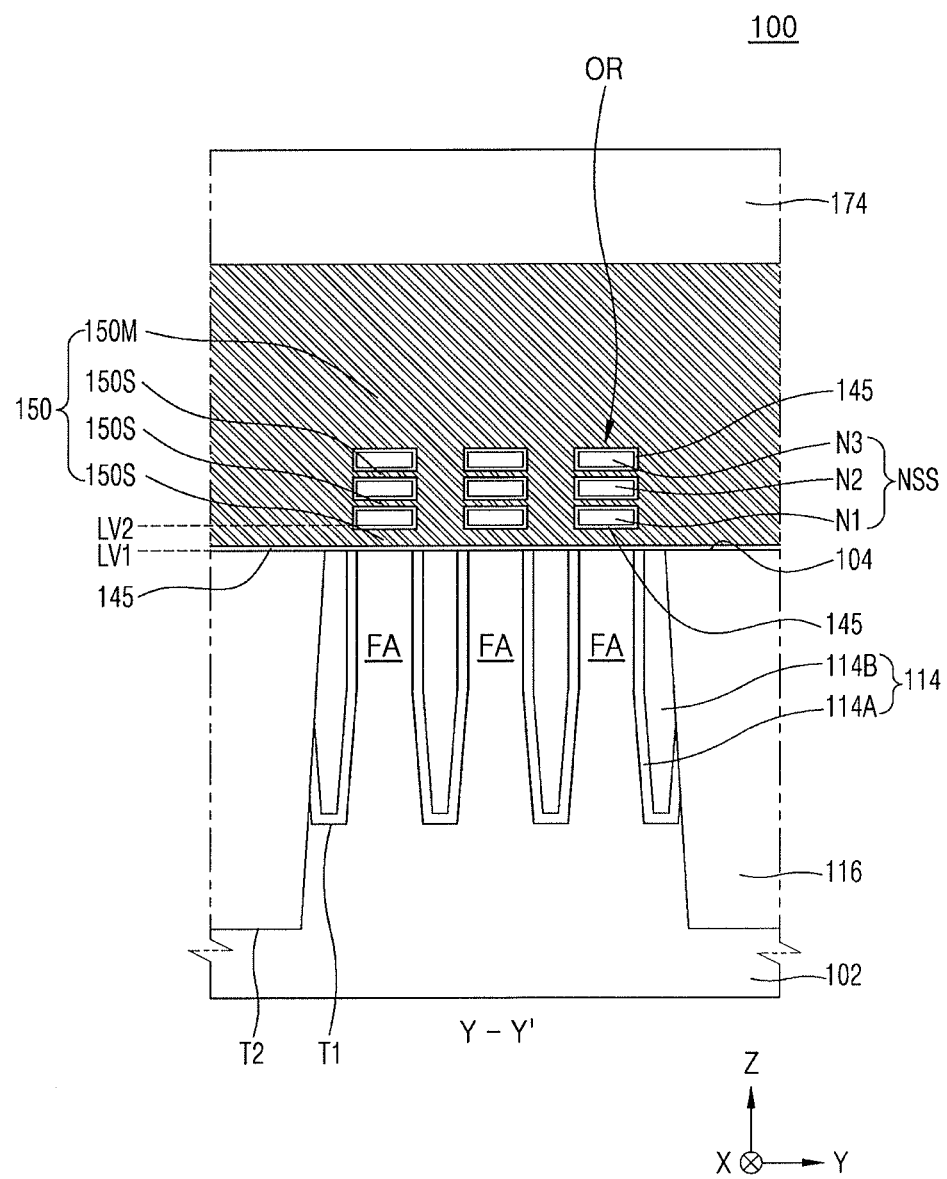

FIGS. 24A to 24C illustrate another embodiment of a semiconductor device 100. FIG. 24A illustrates a planar layout view of the semiconductor device 100. FIG. 24B illustrates a cross-sectional view of line X-X' in FIG. 24A. FIG. 24C illustrates a cross-sectional view of line Y-Y' in FIG. 24A.

Referring to FIGS. 24A through 24C, after an interlayer insulating layer 174 is formed to cover the gates 150 and the integrate insulating layer 172, a plurality of contact holes 190H exposing the semiconductor layers 162A may be formed by partially etching the interlayer insulating layer 174 and the integrate insulating layer 172. Thereafter, metal silicide layers 162B may be formed on upper surfaces of the semiconductor layers 162A exposed through the contact holes 190H. Source/drain regions 162 including the semiconductor layers 162A and the metal silicide layers 162B on the semiconductor layers 162A, and a plurality of contact plugs 190 respectively connected to the semiconductor layers 162A through the metal silicide layers 162B may also be formed, to thereby form the semiconductor device 100.

The semiconductor device 100 may include the plurality of fin-type active areas FA protruding from the substrate 102 and extending in a first direction (X direction) and the plurality of nanosheet stack structures NSS facing the upper surface 104 of the plurality of fin-type active areas FA at locations spaced apart from the upper surface 104 of the plurality of fin-type active areas FA.

The first trenches T1 defining the plurality of fin-type active areas FA and the second trenches T2 defining the device regions DR may be formed in the substrate 102. The second trenches T2 may be deeper than the first trenches T1.

Lower side walls of the fin-type active areas FA may be covered by the STI layers 114 filling the first trenches T1. The STI layers 114 may include the insulating liners 114A conformally covering inner walls of the first trenches T1 and the gapfill insulating layers 114B filling the first trenches T1 on the insulating liners 114A. The second trenches T2 may be filled with the device isolation layers 116. The upper surface 104 of the fin-type active areas FA, upper surfaces of the STI layers 114, and upper surfaces of the device isolation layers 116 may have the same level or similar levels.

The plurality of gates 150 may extend on the fin-type active areas FA in a second direction (Y direction) across the first direction. The fin-type active areas FA may have the upper surface 104 of a first level LV1.

The nanosheet stack structures NSS may be spaced apart from the fin-type active areas FA. The nanosheet stack structures NSS may include the nanosheets N1, N2, and N3 extending in parallel to the upper surface 104 of the fin-type active areas FA on a second level LV2 farther than the first level LV1 from the substrate 102. In the present example, the nanosheet stack structures NSS and the gates 150 are formed on the one fin-type active area FA, and the nanosheet stack structures NSS are arranged in a line along a direction (X direction) in which the fin-type active area FA extends on the one fin-type active area FA. In other embodiments, The number of the nanosheet stack structures NSS on the one fin-type active area FA may be different. Also, for example, one nanosheet stack structure NSS may be formed on the one fin-type active area FA.

The nanosheets N1, N2, and N3 constituting the nanosheet stack structures NSS may be sequentially stacked on the upper surface 104 of the fin-type active areas FA one-by-one. In the present example, the one nanosheet stack structure NSS includes the three nanosheets N1, N2, and N3. In other embodiments, the one nanosheet stack structure NSS may have a different number of nanosheets or a different configuration. For example, the nanosheet stack structure NSS may include one or more than three nanosheets. Each of the nanosheets N1, N2, and N3 may have a channel region.

The gates 150 may be formed to surround at least some of the nanosheets N1, N2, and N3, while covering the nanosheet stack structure NSS. Each of the gates 150 may include the main gate portion 150M covering an upper surface of the nanosheet stack structure NSS and the sub gate portions 150S connected to the main gate portion 150M and formed in spaces between the fin-type active area FA and the nanosheets N1, N2, and N3, e.g., in a lower side of each of the nanosheets N1, N2, and N3. A thickness of each of the sub gate portions 150S may be less than that of the main gate portion 150M. A thickness of the lowermost sub gate portion 150S, among the sub gate portions 150S, may be greater than those of the other sub gate portions 150S. In this regard, the thicknesses of the sub gate portions 150S and the thickness of the main gate portion 150M may be determined with respect to the Z direction in FIGS. 24A to 24C.

A value of a length of each of the sub gate portions 150S may be greater than that of the main gate portion 150M. In this regard, lengths of the sub gate portions 150S and the length of the main gate portion 150M may be determined with respect to the X direction of FIGS. 24A to 24C.

The gate dielectric layer 145 may be formed between the nanosheet stack structure NSS and the gate 150. The nanosheets N1, N2, and N3 may be formed in an overlap region OR covered by the gate 150 in a space between the fin-type active area FA and the gate 150. On an X-Y plane, the nanosheet stack structure NSS including the nanosheets N1, N2, and N3 may have a greater planar area than that of the overlap region OR. A planar shape of the nanosheet stack structure NSS has an approximately rectangular shape in FIG. 24A but may have a different shape in another embodiment. For example, the nanosheet stack structure NSS may have various planar shapes, for example, according to a planar shape of the fin-type active area FA and/or a planar shape of the gate 150.

In some embodiments, the nanosheets N1, N2, and N3 may include a single material. In some embodiments, the nanosheets N1, N2, and N3 may include the same material as that of the substrate 102.

The gate 150 may include a metal containing layer for adjusting a work function and a metal containing layer for filling a gap filling an upper space of the metal containing layer for adjusting the work function. In some embodiments, the gate 150 may have a structure in which a metal nitride layer, a metal layer, a conductive capping layer, and a gap-fill metal layer are sequentially stacked. A structure of the gate 150 may be, for example, the same as the gate forming conductive layer 150L in FIG. 21.

The source/drain regions 162 may be formed on the fin-type active area FA. Each of the source/drain regions 162 may be connected to one end of the neighboring nanosheets N1, N2, and N3.

The source/drain regions 162 may include the semiconductor layers 162A that are epitaxially grown from the nanosheets N1, N2, and N3. The source/drain regions 162 may have an embedded SiGe structure including an epitaxially grown Si layer, an epitaxially grown SiC layer, and a plurality of epitaxially grown SiGe layers. The source/drain regions 162 may include metal silicide layers 162B formed on the semiconductor layers 162A. The metal silicide layers 162B may include, for example, titanium silicide. In some embodiments, the metal silicide layers 162B may be omitted.

The insulating liners 134, the first insulating spacers 136, and the protection layer 138 may be formed on the nanosheet stack structures NSS to sequentially cover side walls of the gates 150. The protection layer 138 may extend to cover the source/drain regions 162. Each of the insulating liners 134, the first insulating spacers 136, and the protection layer 138 may include, for example, a silicon nitride layer. In some embodiments, the protection layer 138 may be omitted.

The insulating liners 134, the first insulating spacers 136, and the protection layer 138 may cover side walls of the main gate portion 150M in the gate 150.

The second insulating spacers 140 may be formed in spaces between the nanosheets N1, N2, and N3 to contact the source/drain regions 162. The second insulating spacers 140 may be between the sub gate portions 150S and the source/drain regions 162 in the spaces between the nanosheets N1, N2, and N3. In some embodiments, the second insulating spacers 140 may include a silicon nitride layer.

The second insulating spacers 140 may cover side walls of at least some of the sub gate portions 150S. As shown in FIG. 24B, respective side walls of the sub gate portion 150S closest to the fin-type active area FA, among the three sub gate portions 150S, may be covered by the buffer semiconductor layers layer 106 covering the upper surface 104 of the fin-type active area FA. The buffer semiconductor layers layer 106 may be partially disposed between the sub gate portion 150S and the second insulating spacer 140 corresponding to the sub gate portion 150S closest to the fin-type active area FA, among the three sub gate portions 150S.

The buffer semiconductor layers layer 106 may include a material different from those of the fin-type active are FA and the nanosheets N1, N2, and N3. For example, the fin-type active area FA may include Si, and the buffer semiconductor layers layer 106 may include Ge.

In some embodiments, the first insulating spacers 136 and the second insulating spacers 140 may insulate layers having surfaces on which seeding and epitaxial growth of semiconductor atoms is impossible.

The air spaces AG may be formed between the second insulating spacers 140 and the semiconductor layers 162A. The air spaces AG may extend while reducing widths from the second insulating spacers 140 to the semiconductor layers 162A in an opposite direction to a direction of the sub gate portions 150S. The air spaces AG may have various shapes, for example, as shown in FIGS. 23A to 23Q.

In some embodiments, the air spaces AG may have a triangular cross-section, a fan-shaped cross-section, or a triangular cross-section having one bulging side on the X-Z plane. In some embodiments, some of the air spaces AG may extend between the nanosheets N1, N2, and N3 and the fin-type active area FA. In some embodiments, apexes of the air spaces AG extending to the semiconductor layers 162A may have a round shape.

In some embodiments, at least one of the air spaces AG between the second insulating spacers 140 and the semiconductor layers 162A may have a unit area different from those of the other air spaces AG on the X-Z plane. For example, a value of a unit area of the lowermost air space AG among the air spaces AG may be smaller than those of the other air spaces AG. In other some embodiments, the value of the unit area of the lowermost air space AG may be the same as or similar to those of other air spaces AG.

Referring to FIGS. 24A through 24C, the integrate insulating layer 172 and the interlayer insulating layer 174 may be sequentially formed on the source/drain regions 162. Each of the integrate insulating layer 172 and the interlayer insulating layer 174 may include a silicon oxide layer or another type of layer.

The contact plugs 190 may be respectively connected to the source/drain regions 162. The contact plugs 190 may be connected to the source/drain regions 162 through the interlayer insulating layer 174, the integrate insulating layer 172, and the protection layer 138. The metal silicide layers 162B may be between the semiconductor layers 162A and the contact plugs 190. The contact plugs 190 may include metal, conductive metal nitride, or a combination of these. For example, the contact plugs 190 may include, for example, W, Cu, Al, Ti, TiN, an alloy of these, or another material.

The semiconductor device 100 described with reference to FIGS. 1 to 24C may include the second insulating spacers 140 contacting the source/drain regions 162 in spaces between the nanosheets N1, N2, and N3 formed on the fin-type active area FA, and may include the air spaces AG between the second insulating spacers 140 and the semiconductor layers 162A of the source/drain regions 162.

For example, the semiconductor device 100 may include the air spaces AG between the second insulating spacers 140 and the semiconductor layers 162A of the source/drain regions 162, while forming the second insulating spacers 140 having a relatively small thickness, e.g., a width in a horizontal direction (X direction). Thus, resistance by the second insulating spacers 140 and capacitance between the sub gate portions 150S of the gates 150 and the semiconductor layers 162A of the source/drain regions 162 may be reduced, thereby enhancing performance of the semiconductor device 100.

A value of a length (in the X direction) of each of the sub gate portions 150S may be greater than that of the main gate portion 150M, to thereby enhance controllability of the semiconductor device 100 by the gates 150. Also, the semiconductor layers 162A may not grow from the second insulating spacers 140. Thus, crystallinity of the semiconductor layers 162A may be enhanced, thereby reducing resistance of the source/drain regions 162 and enhancing efficiency as a stressor.

FIGS. 25 to 29 are cross-sectional views illustrating stages of another embodiment of a method for manufacturing a semiconductor device.

Figure 25:
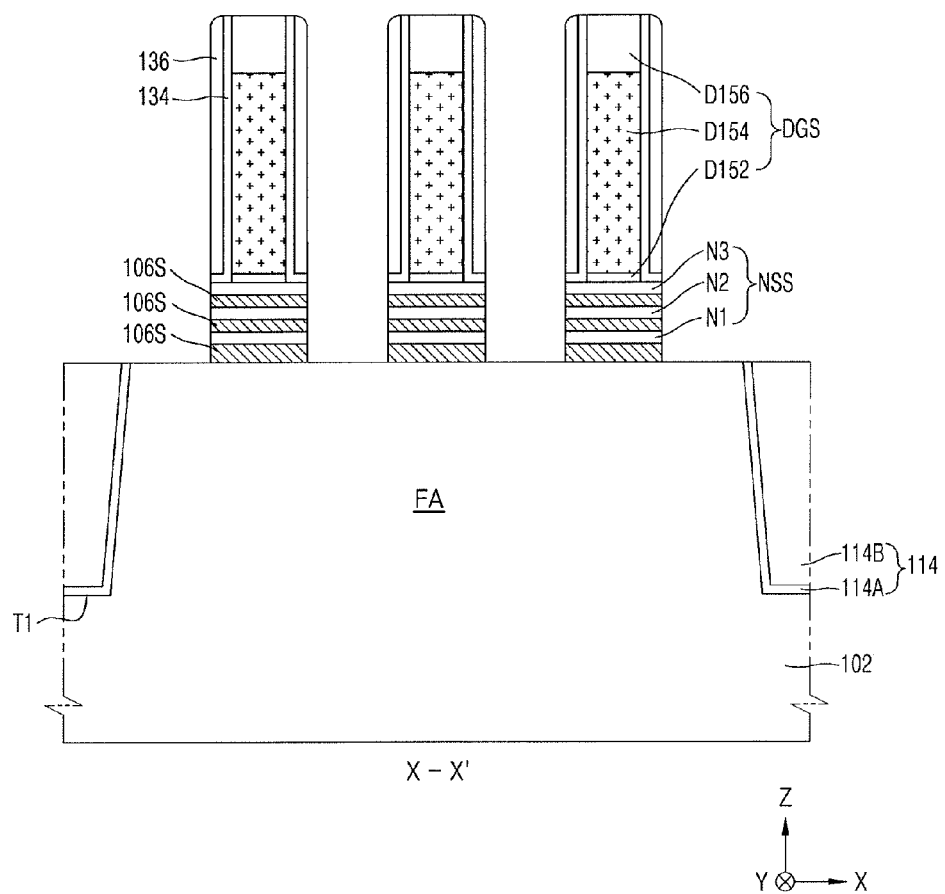
FIGS. 25-29 illustrate various stages in a method for manufacturing a semiconductor device according to another embodiment.

Referring to FIG. 25, nanosheet stack structures NSS including the nanosheets N1, N2, and N3 may be formed on the fin-type active area FA by performing processes described with reference to FIGS. 1 to 9. However, in the present example, unlike FIG. 9, when a stack structure of the sacrificing semiconductor layers 106S and the nanosheet semiconductor layers NS is etched, an etching process may be performed until an upper surface of the fin-type active area FA is exposed. Accordingly, after the nanosheet stack structures NSS are formed, the fin-type active area FA may be exposed between the nanosheet stack structures NSS.

Figure 26:
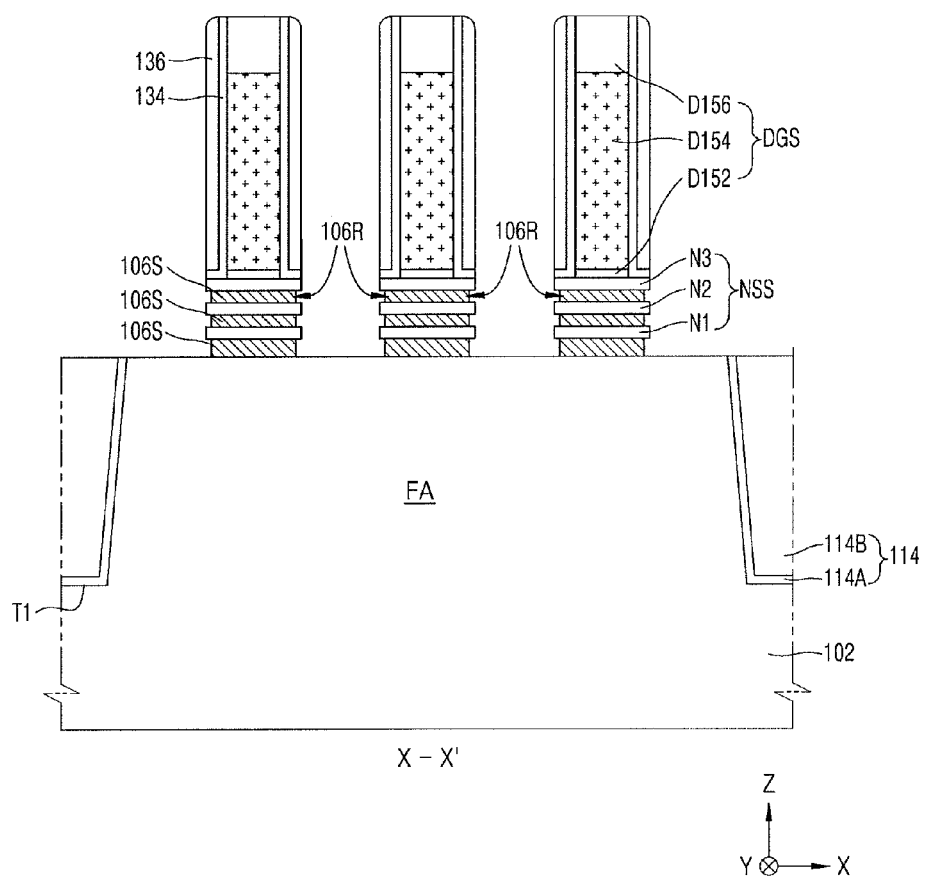

Referring to FIG. 26, in the same manner as described with reference to FIG. 10, the recess regions 106R may be formed between the nanosheets N1, N2, and N3 by removing some of the sacrificing semiconductor layers 106S exposed to respective sides of each of the nanosheet stack structures NSS. The recess regions 106R may have the same depth (X direction) toward each of the sacrificing semiconductor layers 106S from respective side walls of the nanosheets N1, N2, and N3.

To form the recess regions 106R, a value of a width of the remaining sacrificing semiconductor layers 106S, after some of the sacrificing semiconductor layers 106S are removed in a horizontal direction, may greater than that of the dummy gate layers D154 in the horizontal direction. Thus, a value of a width of the recess regions 106R in the horizontal direction may be less than that of a sum of widths of the insulating liners 134 and the first insulating spacers 136 in the horizontal direction.

Figure 27:
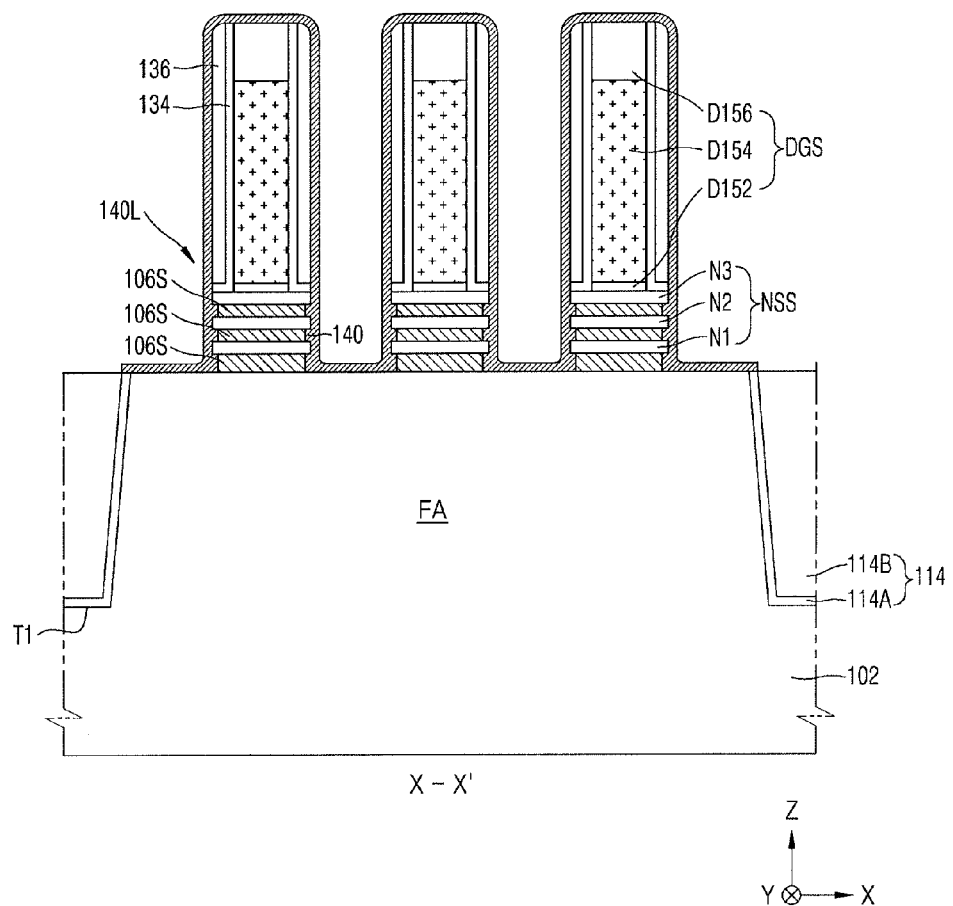

Referring to FIG. 27, in a manner similar to FIG. 11, the insulating structure 140L including the second insulating spacers 140 filling the recess regions 106R (see, e.g., FIG. 26) between the nanosheets N1, N2, and N3 may be formed.

Figure 28:
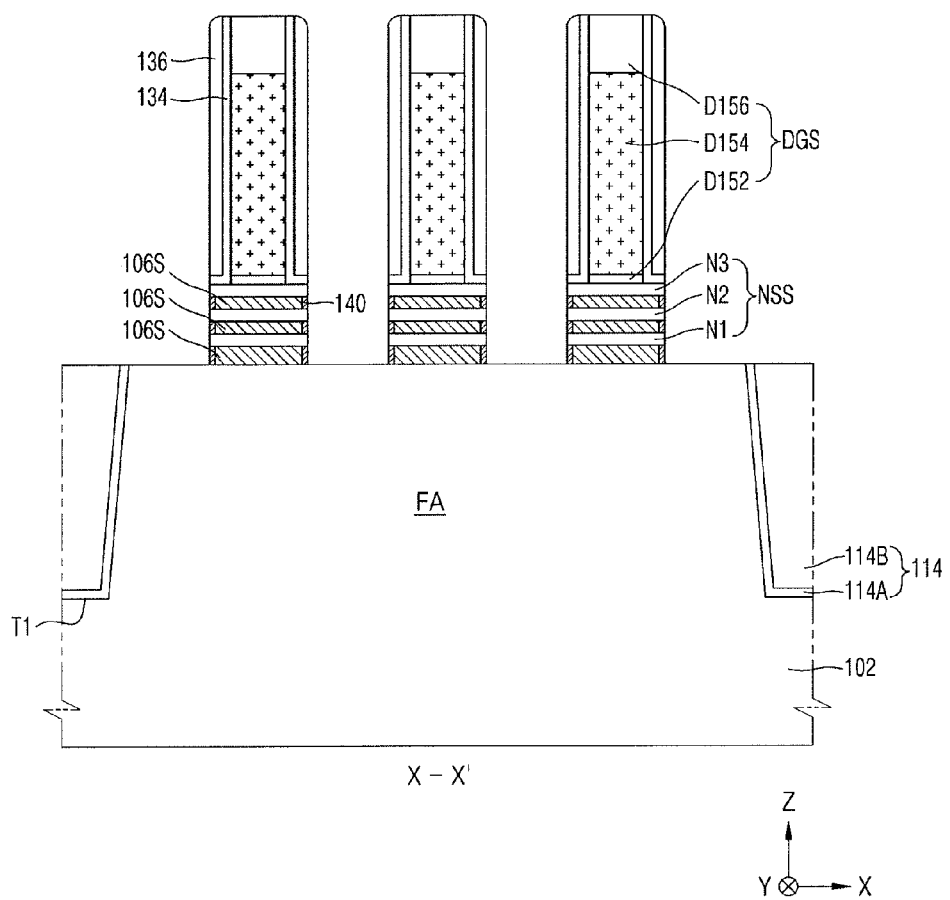

Referring to FIG. 28, in a manner similar to FIG. 12, part of the insulating structure 140L (see, e.g., FIG. 27) outside the recess regions 106R (see, e.g., FIG. 26) may be removed. Thus, only the second insulating spacers 140 filling the recess regions 106R may remain.

As described with reference to FIG. 1, when the thickness of the sacrificing semiconductor layers 106S closest to the substrate 102 among the plurality of sacrificing semiconductor layers 106S, is greater than those of the other sacrificing semiconductor layers 106S, the thickness of the lowermost second insulating spacer 140 in the recess region 106R between the lowermost nanosheet N1 and the fin-type active area FA may be greater than that of the upper second insulating spacer 140 in the recess region 106R between the nanosheets N1, N2, and N3.

Figure 29:
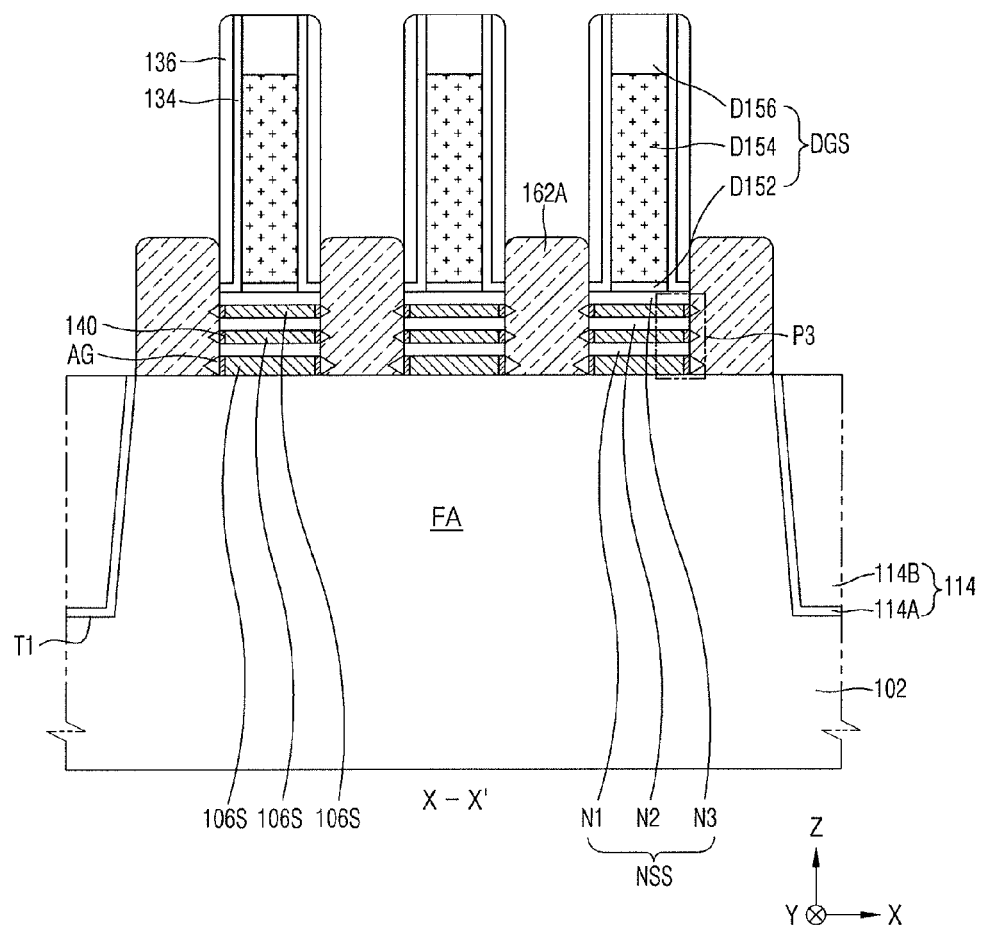

Referring to FIG. 29, the semiconductor layers 162A including air spaces AG between the semiconductor layers 162A and the second insulating spacers 140 may be formed by the processes in FIGS. 13 and 14 on a resultant structure of FIG. 28.

Figure 30A:
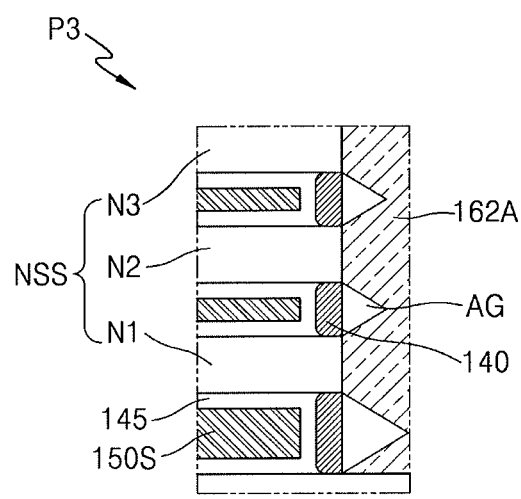
FIGS. 30A-30Q illustrate embodiments of air spaces in a semiconductor device.
Figure 30B:
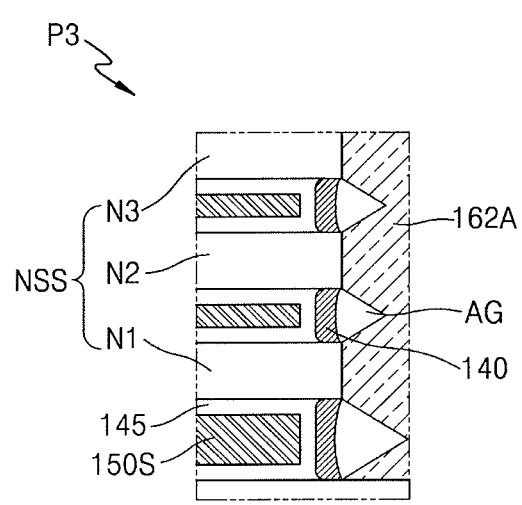
Figure 30C:
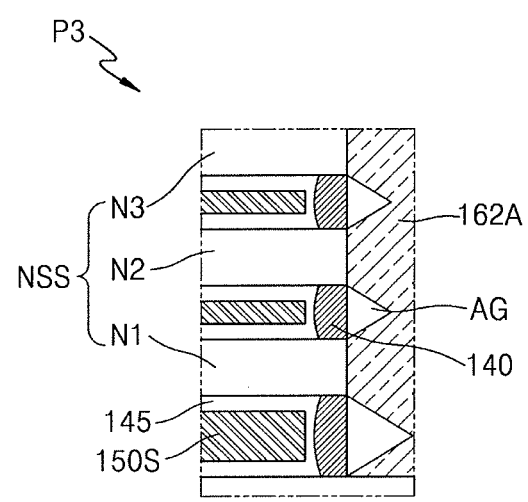
Figure 30D:
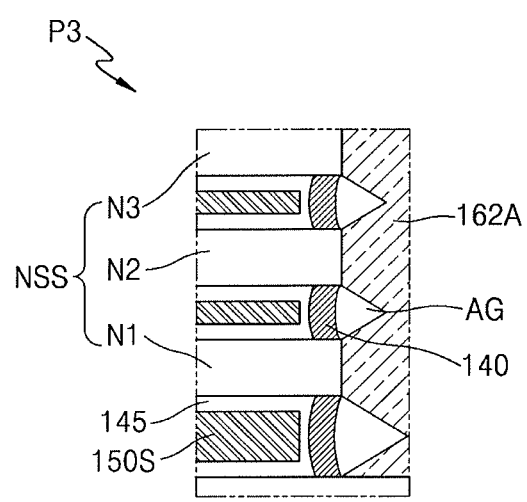
Figure 30E:
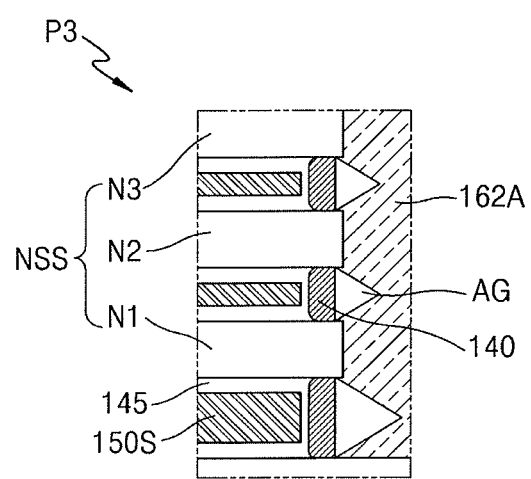
Figure 30F:
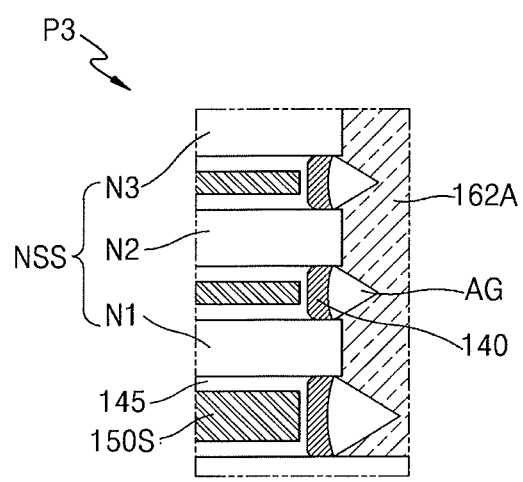
Figure 30G:
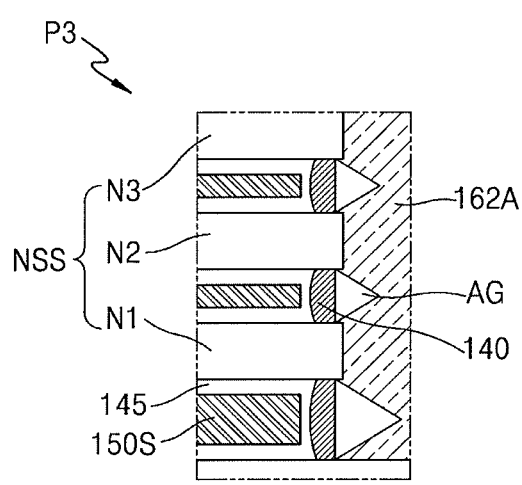
Figure 30H:
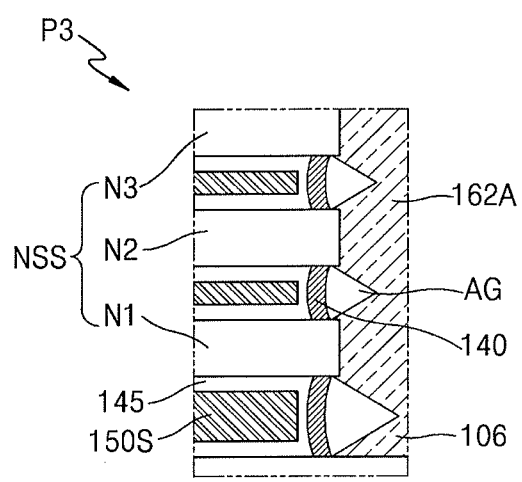
Figure 30I:
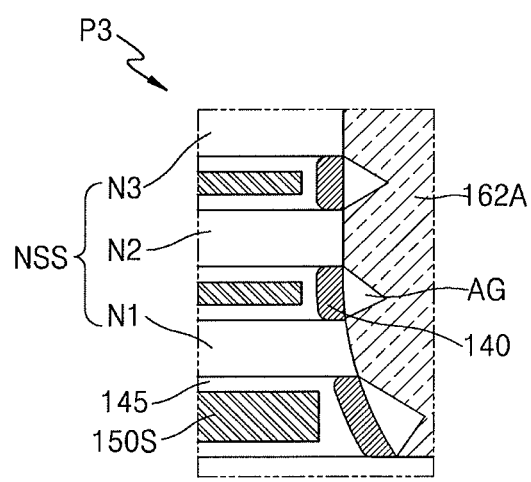
Figure 30J:
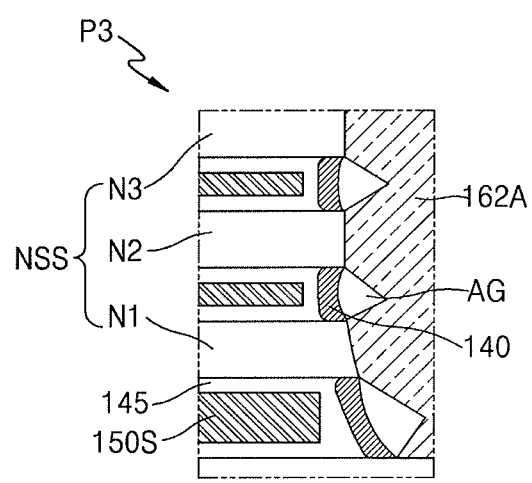
Figure 30K:
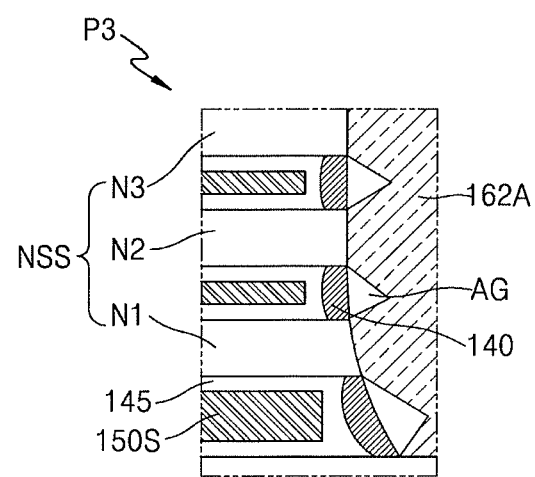
Figure 30L:
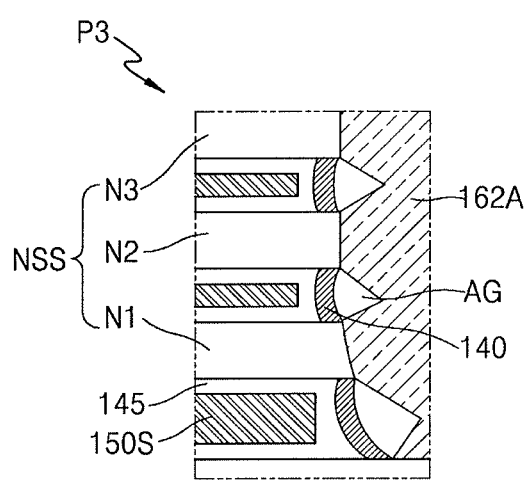
Figure 30M:
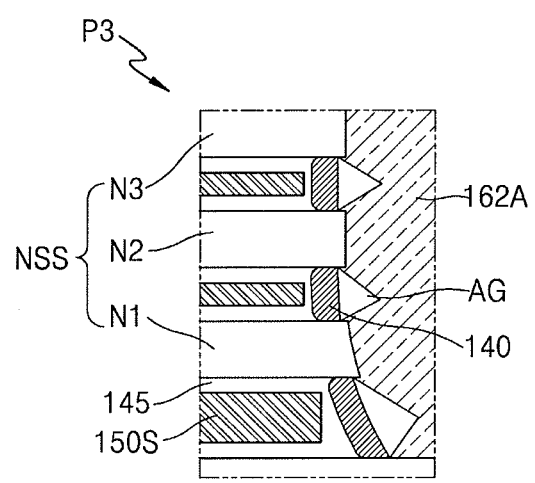
Figure 30N:
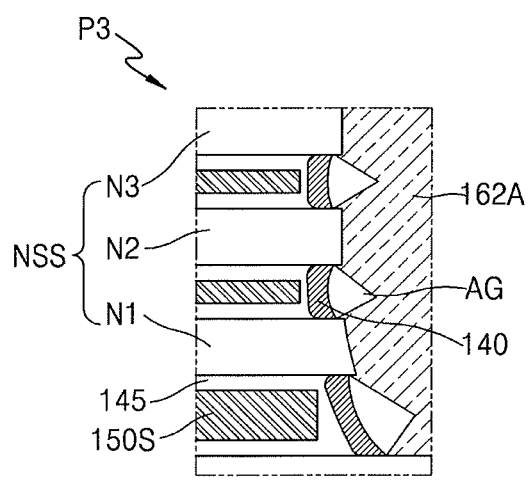
Figure 30O:
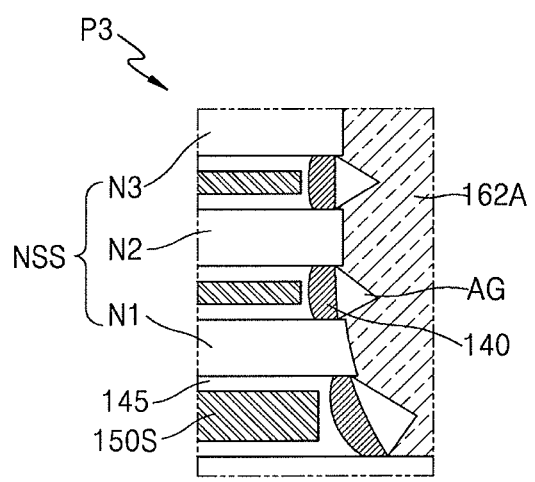
Figure 30P:
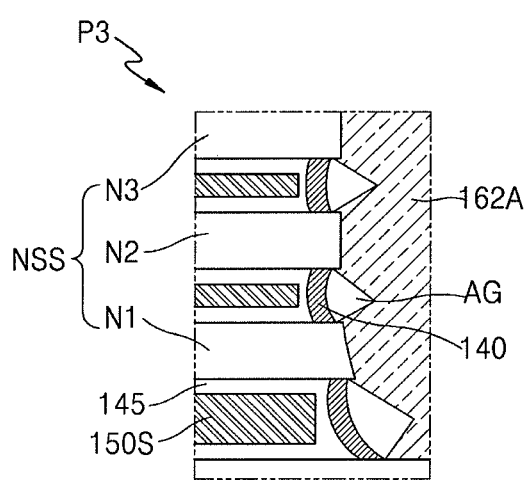
Figure 30Q:
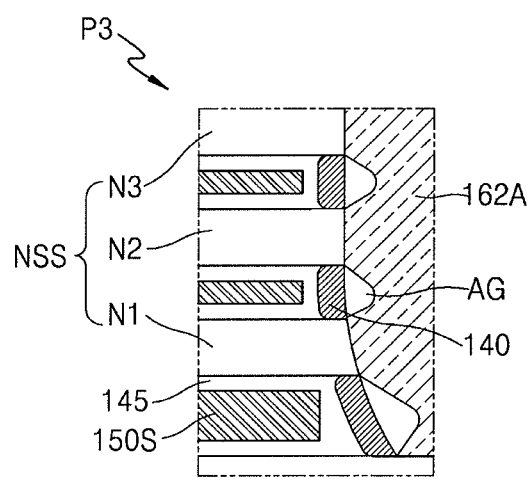

FIGS. 30A to 30Q are cross-sectional views of additional embodiments of air spaces in a semiconductor device. FIGS. 30A to 30Q are enlarged views of a region P3 in FIG. 29. Referring to FIG. 30A, the air spaces AG may extend with decreasing widths from the second insulating spacers 140 to the semiconductor layers 162A, in a direction opposite to a direction of the sub gate portions 150S. The air spaces AG may have a triangular cross-section with apexes in an upper side and a lower side of side surfaces of the second insulating spacers 140 and the semiconductor layers 162A.

The at least one air space AG among the air spaces AG between each of the second insulating spacers 140 and the semiconductor layers 162A may have a unit cross-section different from the other air space AGs on an X-Z plane. The size of a unit cross-section of the air spaces AG on the X-Z plane may be proportional to a vertical height of each of the second insulating spacers 140 corresponding to the air spaces AG in a Z direction. For example, when the vertical height of the lowermost second insulating spacer 140 is less than those of the other second insulating spacers 140, a value of a unit cross-section of the lowermost air space AG may be less than that of other air spaces AG. Thus, a value of a volume of the lowermost air space AG may be less than other air spaces AG.

Referring to FIGS. 30B to 30Q, as described with reference to FIGS. 23B to 23Q, the second insulating spacers 140 and the air spaces AG may have various shapes. For example, the second insulating spacers 140 and the air spaces AG of FIGS. 30B to 30Q may have shapes similar to those of the second insulating spacers 140 and the air spaces AG in FIGS. 23B to 23Q, except that the thickness of the lowermost second insulating spacer 140 may be greater than that of the other second insulating spacers 140. Also, a value of a unit cross-section of the lowermost air space AG may be greater than those of the other air spaces AG.

Figure 31:
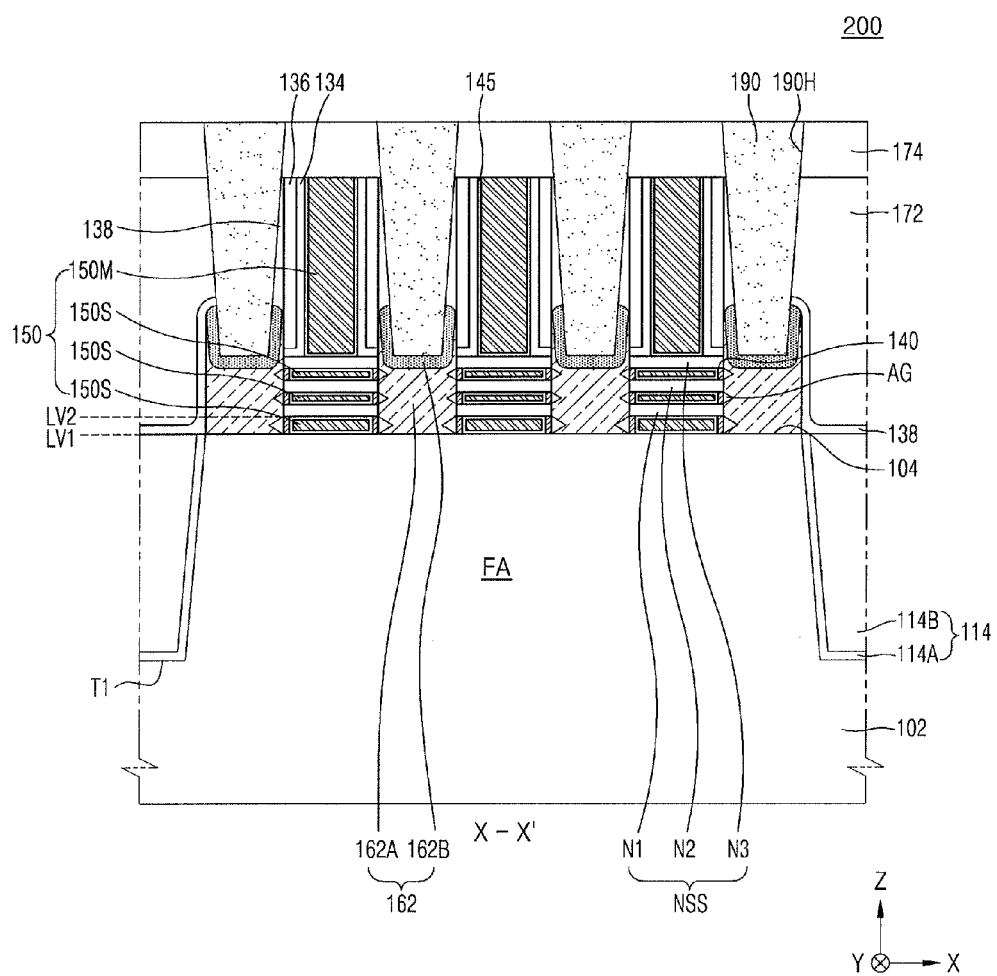
FIG. 31 illustrates another embodiment of a semiconductor device.

FIG. 31 illustrates another embodiment of a semiconductor device 200 which, for example, may be manufactured by performing the processes in FIGS. 24A to 24C on the resultant structure of FIG. 29.

The semiconductor device 200 described with reference to FIGS. 25 to 31 may include the second insulating spacers 140 contacting the source/drain regions 162 in spaces between the nanosheets N1, N2, and N3 formed in the fin-type active areas FA and the air spaces AG between the second insulating spacers 140 and the semiconductor layers 162A of the source/drain regions 162.

For example, the semiconductor device 200 may include the air spaces AG between the second insulating spacers 140 and the semiconductor layers 162A of the source/drain regions 162, with the second insulating spacers 140 having a relatively small thickness, e.g., a width in a horizontal direction (X direction). Thus, resistance by the second insulating spacers 140 and capacitance between the sub gate portions 150S of the gates 150 and the semiconductor layers 162A of the source/drain regions 162 may be reduced, thereby enhancing performance of the semiconductor device 200.

A value of a length (X direction) of each of the sub gate portions 150S may be greater than that of the main gate portion 150M, thereby enhancing controllability of the semiconductor device 100 by the gates 150. The semiconductor layers 162A may not grow from the second insulating spacers 140. Thus, crystallinity of the semiconductor layers 162A may be enhanced, thereby reducing resistance of the source/drain regions 162 and enhancing efficiency as a stressor.

The semiconductor devices 100 and 200 include transistors having nanosheet channel regions formed in fin-type active region of a 3D structure. These devices and their methods of manufacture are described with reference to FIGS. 1 through 31. In other embodiments, integrated circuit devices including planar MOSFETs having characteristics according to the embodiments described herein and methods for manufacturing the integrated circuit devices may be provided via various modifications and changes made without departing from the spirit of these embodiments.

Figure 32:
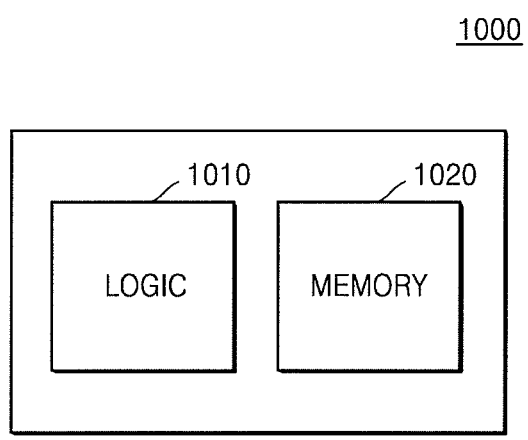
FIG. 32 illustrates an embodiment of an electronic device.

FIG. 32 illustrates an embodiment of an electronic device 1000 which may include a logic region 1010 and a memory region 1020. The logic region 1010 may include various types of logic cells including a plurality of circuit elements, such as a transistor and a register, as standard cells performing desired logical functions, such as a counter and a buffer. The logic cells may constitute, for example, an AND, a NAND, an OR, a NOR, an exclusive OR (XOR), an exclusive NOR (XNOR), an inverter (INV), an adder (ADD), a buffer (BUF), a delay (DLY), a filter (FILL), a multiplexer (MXT/MXIT), an OR/AND/INVERTER (OAI), an AND/OR (AO), an AND/OR/INVERTER (AOI), a D flip-flop, a reset flip-flop, a master-slaver flip-flop, or a latch. However, the aforementioned cells are merely examples, and other types of logic cells may be used in other embodiments.

The memory region 1020 may include at least one of SRAM, DRAM, MRAM, RRAM, and PRAM. The logic region 1010 and the memory region 1020 may include any of the embodiments of the semiconductor devices described herein.

Figure 33:
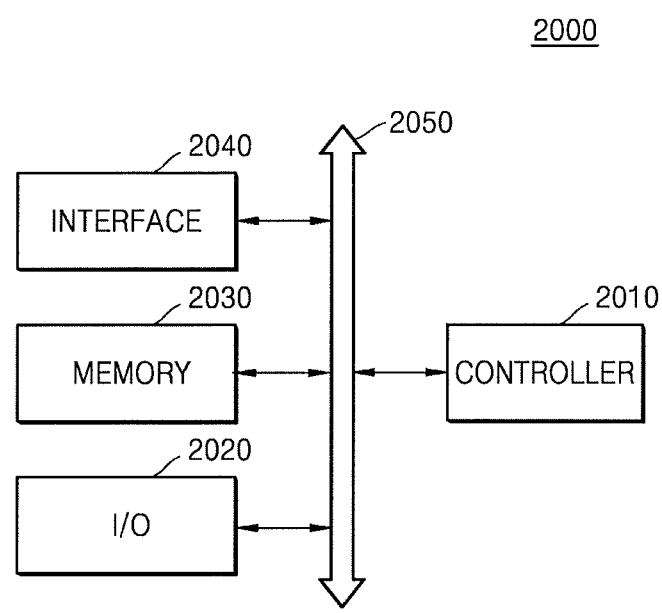
FIG. 33 illustrates an embodiment of an electronic system.

FIG. 33 illustrates an embodiment of an electronic system 2000 which may include a controller 2010, an input/output (I/O) device 2020, a memory 2030, and an interface 2040, which are connected to each other via a bus 2050. The controller 2010 may include at least one of a microprocessor, a digital signal processor, or a processing device that is similar to these devices. The I/O device 2020 may include at least one of a keypad, a keyboard, or a display. The memory 2030 may store commands executed by the controller 2010 and/or user data.

The electronic system 2000 may form a wireless communication device, or a device for transmitting and/or receiving information under a wireless environment. The interface 2040 may be implemented as a wireless interface in order to enable the electronic system 2000 to transmit/receive data over a wireless communication network. The interface 2040 may include an antenna and/or a wireless transceiver. According to some embodiments, the electronic system 2000 may be used in a communication interface protocol of a 3G communication system, for example, code division multiple access (CDMA), a global system for mobile communications (GSM), north American digital cellular (NADC), extended-time division multiple access (E-TDMA), and/or wide band code division multiple access (WCDMA). The electronic system 2000 may include any of the embodiments of the semiconductor devices described herein.

Example embodiments have been disclosed herein, and although specific terms are employed, they are used and are to be interpreted in a generic and descriptive sense only and not for purpose of limitation. The embodiments (or portions thereof) may be combined to form additional embodiments. In some instances, features, characteristics, and/or elements described in connection with a particular embodiment may be used singly or in combination with features, characteristics, and/or elements in connection with other embodiments unless otherwise indicated. Accordingly, it will be understood by those of skill in the art that various changes in form and details may be made without departing from the spirit and scope of the embodiments set forth in the claims.

What is claimed is:

1. A semiconductor device, comprising:
   a fin-type active area protruding from a substrate in a first direction;
   a plurality of nanosheets spaced from and extending parallel to an upper surface of the fin-type active area, each of the nanosheets including a channel region;
   a gate extending over the fin-type active area in a second direction crossing the first direction and surrounding at least some of the nanosheets;
   a source/drain region connected to the nanosheets; and
   insulating spacers disposed between the upper surface of the fin-type active area and the nanosheets, disposed between the nanosheets, wherein air spaces are between the insulating spacers and the source/drain region based on positions of the insulating spacers.

2. The semiconductor device as claimed in claim 1, wherein:

the gate includes a first gate portion with a first thickness on the nanosheets and a plurality of second gate portions filling spaces between the fin-type active area and the nanosheets, each of the second gate portions having a second thickness less than the first thickness, and the insulating spacers cover side walls of the second gate portions.

3. The semiconductor device as claimed in claim 2, wherein the second gate portions are longer than the first gate portion in the first direction.

4. The semiconductor device as claimed in claim 3, wherein a lowermost one of the second gate portions is thicker than other ones of the second gate portions.

5. The semiconductor device as claimed in claim 2, wherein a volume of air spaces between insulating spacers covering side walls of a lowermost one of the second gate portions and the source/drain region is different from volumes of air spaces between insulating spacers covering side walls of other ones of the second gate portions and the source/drain region.

6. The semiconductor device as claimed in claim 5, wherein vertical heights of the insulating spacers covering the side walls of the lowermost one of the second gate portion is different from heights of the insulating spacers covering the side walls of the other ones of the second gate portions.

7. The semiconductor device as claimed in claim 1, wherein a vertical height of the insulating spacers covering the side walls of the lowermost one of the second gate portions is less than those of the insulating spacers covering the side walls of other ones of the second gate portions.

8. The semiconductor device as claimed in claim 1, wherein vertical heights of the air spaces with respect to the upper surface of the fin-type active area decrease in a direction toward the source/drain region.

9. The semiconductor device as claimed in claim 1, wherein the air space extends between the nanosheets and the fin-type active area.

10. The semiconductor device as claimed in claim 1, wherein each of the air spaces protrudes toward the insulating spacer.

11. A semiconductor device, comprising:
a substrate including an active area;
at least one nanosheet stack structure spaced from and facing an upper surface of the active area, the at least one nanosheet stack structure including a plurality of nanosheets, each of the nanosheets including a channel region;
a gate extending over the active area in a second direction and covering the at least one nanosheet stack structure, the gate including a first gate portion on the at least one nanosheet stack structure and a plurality of second gate portions, each of the plurality of second gate portions being under a lower side of each of the nanosheets;
a gate dielectric layer between the at least one nanosheet stack structure and the gate;
a source/drain region connected to one end of each of neighboring ones of the nanosheets;
a first insulating spacer on the nanosheets and covering side walls of the gate; and
a plurality of second insulating spacers disposed between the gate and the source/drain region, disposed between the upper surface of the active area and the at least one nanosheet stack structure, and disposed between the nanosheets, wherein a plurality of air spaces are disposed between the plurality of second insulating spacers and a first area of the source/drain region based on positions of the plurality of second insulating spacers and disposed to overlap a second area of the source/drain region.

12. The semiconductor device as claimed in claim 11, wherein: a volume of at least one of the air spaces at a first level with respect to the upper surface of the active area is different from volumes of air spaces at one or more different levels.

13. The semiconductor device as claimed in claim 11, wherein each of the second gate portions is longer than the first gate portion.

14. The semiconductor device as claimed in claim 11, wherein vertical heights of the air spaces with respect to the upper surface of the active area decrease in a direction from the plurality of second insulating spacers to the source/drain region.

15. A semiconductor device, comprising:
a substrate including an active area;
at least one nanosheet stack structure spaced from and facing an upper surface of the active area, the at least one nanosheet stack structure including a plurality of nanosheets, each of the nanosheets including a channel region;
a gate extending over the active area in a second direction and covering the at least one nanosheet stack structure, the gate including a first gate portion on the at least one nanosheet stack structure and a plurality of second gate portions on a lower side of each of the nanosheets;
a source/drain region connected to one end of each of neighboring ones of the nanosheets; and
a plurality of first insulating spacers between the gate and the source/drain region in spaces between the upper surface of the active area and the at least one nanosheet stack structure and spaces between the nanosheets, wherein a plurality of air spaces are between the plurality of first insulating spacers and a first area of the source/drain region and overlapping a second area of the source/drain region.

16. The semiconductor device as claimed in claim 15, wherein each of the plurality of air spaces is disposed on a side surface of each of the plurality of first insulating spacers, and each of the plurality of air spaces tapers in width in a direction toward the source/drain region.

17. The semiconductor device as claimed in claim 15, wherein each of the plurality of air spaces protrudes toward the first insulating spacer.

18. The semiconductor device as claimed in claim 15, wherein a volume of at least one of the air spaces at a first level with respect to the upper surface of the active area is different from volumes of air spaces at one or more different levels.

19. The semiconductor device as claimed in claim 15, wherein each of the plurality of second gate portions is longer than the first gate portion.

20. The semiconductor device as claimed in claim 15, wherein vertical heights of the air spaces with respect to the upper surface of the active area decrease in a direction from the first insulating spacers to the source/drain region.

* * * * *